United States Patent [19]
Yamada et al.

[11] Patent Number: 5,903,031
[45] Date of Patent: May 11, 1999

[54] MIS DEVICE, METHOD OF MANUFACTURING THE SAME, AND METHOD OF DIAGNOSING THE SAME

[75] Inventors: Takayuki Yamada; Takashi Nakabayashi; Masatoshi Arai; Toshiki Yabu; Koji Eriguchi, all of Osaka, Japan

[73] Assignee: Matsushita Electric Industrial Co., Ltd., Osaka, Japan

[21] Appl. No.: 08/675,659

[22] Filed: Jul. 3, 1996

[30] Foreign Application Priority Data

Jul. 4, 1995 [JP] Japan ................................ 7-168460
Apr. 12, 1996 [JP] Japan ................................ 8-090879

[51] Int. Cl.⁶ ................................................. H01L 29/78
[52] U.S. Cl. ........................ 257/356; 257/491; 257/773
[58] Field of Search ................................ 257/355, 356, 257/491, 537, 786, 773

[56] References Cited

U.S. PATENT DOCUMENTS

| | | | |
|---|---|---|---|
| 5,557,127 | 9/1996 | Ajit et al. | 257/491 |
| 5,629,552 | 5/1997 | Zommer | 257/490 |
| 5,650,651 | 7/1997 | Bui | 257/786 |

FOREIGN PATENT DOCUMENTS 61-263276 11/1986 Japan ................................ 257/356
2-297960 12/1990 Japan ................................ 257/356

*Primary Examiner*—Donald L. Monin, Jr.
*Attorney, Agent, or Firm*—McDermott, Will & Emery

[57] ABSTRACT

In a first region of a semiconductor substrate, there are formed MIS transistors each composed of a gate insulating film, a gate electrode, and source/drain regions. In a second region of the semiconductor substrate, there is formed an impurity diffusion layer serving as a conductive layer. On an interlayer insulating film, there are formed an antenna interconnection connected to the gate electrodes and an interconnection for charge dissipation connected to the conductive layer. During the process of dry etching for forming the interconnections, charges move into the semiconductor substrate via the interconnection for charge dissipation. The deterioration of the gate insulating film caused by the injection of charges into the gate electrode is suppressed and the degradation of characteristics of the MIS transistor including a shift in threshold is also suppressed. Even in the case where a floating interconnection region is present contiguously to the antenna interconnection, the provision of the interconnection for charge dissipation reduces the amount of shift in the threshold of each of the MIS transistors and equalizes the respective thresholds of the MIS transistors.

13 Claims, 18 Drawing Sheets

MIS DEVICE, METHOD OF MANUFACTURING THE SAME, AND METHOD OF DIAGNOSING THE SAME

BACKGROUND OF THE INVENTION

The present invention relates to the structure of a MIS device in which MIS transistors each comprising a gate electrode, a gate insulator film, and source/drain regions are disposed. More particularly, it relates to a method of preventing characteristics of the MIS device from being degraded by charges injected into the gate oxide film during dry etching.

As higher integration has been achieved in a semiconductor integrated circuit in recent years, semiconductor elements such as a MIS transistor disposed in a MIS device composing the semiconductor integrated circuit have been increasingly miniaturized. With the miniaturization of the MIS transistor, the thickness of a gate insulating film has been reduced accordingly. Specifically, a gate insulating film as thin as 6 to 8 nm is employed in the case where 0.25-$\mu$m design rules are used.

When the thickness of the gate insulating film is reduced, the amount of charges injected into the gate insulating film during the use of the semiconductor device is also increased, resulting in such defects as a trap in the gate insulating film, which may cause problems including a reduction in the life of the gate insulating film. To overcome the problems, a power-source voltage is lowered from, e.g., 5 V to 3.3 V.

There may be cases where a voltage higher than the power-source voltage is applied to the gate insulating film during the manufacturing process of the semiconductor device. For example, although a metal film should selectively be removed by dry etching to form a metal interconnection connected to a gate electrode, electric charges injected from plasma into the metal film or generated during the process of removing the metal film are accumulated in the metal interconnection. With the accumulation of charges, an extremely high voltage of 10 V or more may be applied to the gate insulating film. In worst cases, the gate insulating film may break down. Even though the gate insulating film does not break down, characteristics of the transistors may be degraded (a variation in threshold voltage or a reduction in saturation current), which poses a large obstacle to device miniaturization. Such a phenomenon, termed an antenna effect, presents a serious problem as the gate insulating film becomes thinner.

To suppress the above antenna effect, the adoption of the following methods can be considered:

(A) First, minimize wiring length which may cause charge concentration.

(B) Second, reduce the amount of charges injected from the plasma into the interconnection during dry etching.

(C) Third, immediately remove charges accumulated in the interconnection.

The first method (A), also associated with higher integration of the device, is extremely important. However, the circuit is complicated in most cases since the placement and routing of interconnections is performed automatically using a conventional CAD tool, unless a custom LSI chip is designed. As a result, the wiring length tends to increase as the number of semiconductor elements in the MIS device increases.

The second method (B) goes against the trend of processing technology toward a miniaturized semiconductor device. As interconnect patterns to be formed are reduced in size, the density of the plasma should be increased during the etching process, so that a large amount of charges are generated. Hence, it is practically difficult to adopt the second method (B).

On the other hand, the third method (C) is considered to be highly practical, since it exerts substantially no adverse effect on the semiconductor device. By way example, the third method (C) will be described with reference to FIGS. 14 to 16.

FIG. 14 is a cross-sectional view showing a conventional semiconductor device in the manufacturing process thereof. A LOCOS film 12 as an isolation is formed on an n-type semiconductor substrate 11. A p-channel MOS transistor composed of a gate oxide film 13, source/drain regions (not shown), and a gate electrode 14 is formed in a first region Re1 surrounded by the LOCOS film 12. A p-type impurity diffusion layer 15 is formed in a second region Re2 also surrounded by the LOCOS film 12 to form a diode in conjunction with the n-type semiconductor substrate 11. After the interlayer insulating film 16 is deposited on the substrate, an antenna interconnection 21 connected to the gate electrode 13 via a contact plug filled in a contact hole extending through the interlayer insulating film 16 and reaching the gate electrode 13 is formed. During the step, another contact hole extending through the interlayer insulating film 16 and gate insulating film 13 and reaching the p-type impurity diffusion layer 15 is also formed to provide a connection between the antenna interconnection 21 and the semiconductor substrate 11 via the p-type impurity diffusion layer 15, i.e., via the diode. In this manner, the charges injected into the antenna interconnection 21 or generated during dry etching are dissipated into the semiconductor substrate 11 via the p-type impurity diffusion layer 15.

FIG. 15 is a circuit diagram of a conventional p-channel MOS transistor corresponding to FIG. 14. FIG. 16 is a plan view showing the disposition of interconnections 21 in the conventional p-channel MOS transistor corresponding to FIG. 14.

However, in a conventional semiconductor device as shown in FIG. 14, a capacitance corresponding to a bypass portion connected to the p-type impurity diffusion layer 15 of the interconnection 21 connected to the gate electrode 14 is added as wiring capacitance to the original capacitance of the antenna interconnection, which prevents circuit operation at higher speed. Moreover, the potential of the interconnection 21 is varied by a leakage current appearing in the diode in the semiconductor substrate 11, which in turn varies a signal propagated along the interconnection 21.

In addition, there is another problem that the amount of charges accumulated in the interconnection connected to the gate electrode differs in accordance with the disposition of other interconnections surrounding the interconnection connected to the gate electrode. According to the result of an experiment conducted by the present inventors, even when the total amount of charges incident upon the entire wafer is controlled and optimized, characteristics vary from one transistor to another composing an actual integrated circuit. That is, it has been elucidated that the amount of charges injected into the gate insulating film via the interconnection during the dry-etching process depends not only on the interconnection connected to the gate electrode, but also on the disposition of the other interconnections present in proximity (on a spacing equal to or less than 1 $\mu$m) to the interconnection connected to the gate electrode. Consequently, variations in the characteristics of individual transistors are largely dependent on the layout of other interconnections which are not connected to the interconnection connected to the gate electrode. In the actual integrated circuit, the layout of the interconnection connected to the gate electrode of the transistor and the interconnections present contiguously to the interconnection connected to the gate electrode is completely different from one transistor to another. Consequently, a new technique becomes necessary to suppress variations in the threshold voltage and in the value of saturation current of the individual transistors in the integrated circuit.

FIG. 17(a) is a plan view showing the presence of a floating interconnection region Rfw in which floating interconnections are densely disposed in close proximity to a metal interconnection MW connected to the gate electrode of a MOS transistor TR. FIG. 17(b) is data indicating variations in the characteristics of the MOS transistor or shifts in threshold Vth with respect to variations in the number of floating interconnections in the case of FIG. 17(a). The floating interconnection is defined here as an interconnection connected neither to the gate electrode nor to any region on the semiconductor substrate in forming the interconnection to be connected to the gate electrode and hence is in an electrically floating state. The occupation ratio of the floating interconnections in the floating interconnection region Rfw is 50%. The floating interconnection region Rfw has a width of 0 to 120 μm and a length of 100 μm. The occupation ratio of the interconnections (or density of the interconnections) is defined here as a ratio of the area occupied by the floating interconnections to the sum of the area of a blank portion around the floating interconnections and the area occupied by the floating interconnections. As can be understood from FIG. 17(b), the amount of shift in threshold voltage and the amount of increase in the value of saturation current increase with an increase in the width of the floating interconnection region Rfw contiguous to the metal interconnection MW connected to the gate electrode and degradation of the characteristics of the transistor is aggravated. Although FIGS. 17 show the case where the occupation ratio of the floating interconnections in the floating interconnection region Rfw is 50%, the amount of threshold shift and the amount of increase in the value of saturation current exhibit similar tendencies provided that the occupation ratio of the floating interconnections is 40% or more.

The shift in the threshold of the MOS transistor is suppressed to a certain degree by thermal processing performed after dry etching. However, it is highly possible that the original characteristics of the MOS transistor will not be restored satisfactorily by the thermal processing after dry etching with future increases in the width of the floating interconnection region.

Next, a mechanism whereby charges are accumulated in the gate electrode during the dry-etching process and a mechanism whereby the characteristics of the MOS transistor vary due to the accumulation of charges will be described with reference to FIGS. 18.

FIGS. 18(a) and 18(b) are cross-sectional views each illustrating the formation of the antenna interconnection MW connected to the gate electrode GT of the MOS transistor by dry etching, of which FIG. 18(a) shows the case where floating interconnections are absent in a region contiguous to the antenna interconnection MW and FIG. 18(b) shows the case where the floating interconnection region Rfw is present in the region contiguous to the antenna interconnection MW.

As shown in FIGS. 18(a) and 18(b), it is well known that a photoresist film is negatively charged with electrons supplied from a plasma region as a plasma ion source during a normal dry-etching process. As a result, the supply of the electrons from the plasma to the floating interconnection is intervened in the floating interconnection region Rfw, so that a balance between positive charges and negative charges is destroyed. In practice, an excessive amount of positive charges are supplied in most cases. The presence of the photoresist films Rm1b and Rm1c charged positively to a great extent in the contiguous region increases not only the amount of charges injected from the plasma ion source into the floating interconnections but also the amount of charges injected from the plasma ion source into the antenna interconnection MW. In other words, the amount of charges injected into the contiguous interconnection MW is increased by an increased charge imbalance in the presence of the floating interconnections.

By the foregoing action, the amount of charges injected into the gate electrode GT in the interconnection MW shown in FIG. 18(b) becomes larger than the amount of charges injected into the gate electrode GT connected to the isolated interconnection MW shown in FIG. 13(a). Since the amount of defects including a trap in the gate insulating film differs depending on different amounts of charges injected into the gate insulating films of the respective MOS transistors, the amount of shift in the threshold of the MOS transistor is different accordingly, resulting in variations in threshold.

Such a layout containing a floating interconnection region Rfw as described above is frequently observed in an integrated circuit. For example, there may be formed a dummy floating interconnection in a portion corresponding to a concave portion of the interlayer insulating film for planarization or alternatively there may be formed an auxiliary interconnection connected to an upper interconnect layer but not connected to any member and electrically floating when it is formed.

Influences exerted on the antenna interconnection by the floating interconnection region are extremely important in performing process design and device design in consideration of variations in characteristics. For example, to suppress a variation in the threshold voltage of the transistor induced by a damage during the dry-etching process to 20 mV or less in the case shown in FIG. 17(a), layout design should be performed such that no interconnection region at an occupation ratio of 50% consisting only of floating interconnections each having a length larger than 100 μm and a width larger than 5 μm is disposed contiguously to the interconnection MW connected to the gate electrode.

SUMMARY OF THE INVENTION

A first object of the present invention is to provide a MIS device which suppresses an increase in the capacitance of an antenna interconnection connected to a gate electrode as well as a variation in the potential of the interconnection resulting from a leakage in a semiconductor substrate and to provide a method of manufacturing the same.

A second object of the present invention is to provide a MIS device wherein the characteristics of a MIS transistor vary only slightly even when the floating interconnection region containing floating interconnections is in close proximity to the interconnection connected to the gate electrode of the MIS transistor with the provision of means for suppressing the injection of charges into a gate insulating film caused by the charging of the photoresist film on the floating interconnection and to provide a method of manufacturing the same.

A third object of the present invention is to provide a MIS device wherein the characteristics of a MIS transistor vary only slightly even when the occupation ratio of floating interconnections in a region contiguous to an interconnection connected to a gate electrode differs from one MIS transistor to another with the provision of means for equalizing the amount of charges injected into the gate insulating film of the MIS transistor and to provide a method of manufacturing the same.

A fourth object of the present invention is to provide a method of diagnosing a MIS device having a multilayer interconnect structure whereby it becomes possible to judge whether or not the characteristics of a MIS transistor are proper in the designing stage with the provision of means for reliably sensing the state of connection of interconnections in each region of the individual interconnect layers.

To achieve the above first object, a first MIS device of the present invention comprises: a semiconductor substrate; a MIS transistor formed in a first region of the above semiconductor substrate and having a gate electrode, a gate insulating film, and source/drain regions; an interlayer insulating film formed above the above semiconductor substrate and the above MIS transistor; a first interconnection formed on the above interlayer insulating film and connected to the gate electrode of the above MIS transistor; a conductive layer formed in a second region of the above semiconductor substrate; and a second interconnection formed in proximity to the above first interconnection on the above interlayer insulating film and connected to the conductive layer in the second region of the above semiconductor substrate.

With the arrangement, charges move to the semiconductor substrate via the second interconnection while the conductive film is selectively removed by dry etching to form the first and second interconnections. When dry etching is complete, the first and second interconnections are separated from each other and subjected to over-etching. The potential of the second interconnection becomes lower than that of the first interconnection even during over-etching when charges are injected from a plasma ion source, so that more charges are injected into the second interconnection. Consequently, the amount of charges accumulated in the gate electrode connected to the first interconnection is reduced, which suppresses degradation of the gate insulating film due to injected charges. Further, separation of the first interconnection and the second interconnection from each other results in small parasitic capacity and no influence of current leakage at the connection part of the second interconnection and the semiconductor substrate to the MIS transistor.

The above first and second interconnections may be composed of the same material and have the same thickness.

The arrangement enables the first and second interconnections to be formed in the same process step so that manufacturing cost is reduced accordingly compared with the case where the first and second interconnections are formed in different process steps.

The present invention exerts remarkable effects when embodied in the following preferred forms.

Specifically, it is preferred that the above first interconnection has a length of 1 mm or more, that the above first interconnection and the above second interconnection extend in proximity to each other over a length of 100 $\mu$m or more, and that a spacing between the above first interconnection and the above second interconnection is equal to or less than a minimum design rule. Alternatively, it is preferred that a spacing between the above first interconnection and the above second interconnection is equal to or less than 1.0 $\mu$m.

In the first MIS device, when the above first interconnection is an external pad connected to the gate electrode of the above MIS transistor, the above second interconnection is formed to surround the above external pad.

To achieve the above second object, a second MIS device of the present invention comprises: a semiconductor substrate; a MIS transistor formed in a first region of the above semiconductor substrate and having a gate electrode, a gate insulating film, and source/drain regions; an interlayer insulating film formed above the above semiconductor substrate and the above MIS transistor; a first interconnection formed on the above interlayer insulating film and connected to the gate electrode of the above MIS transistor; a floating interconnection region formed in proximity to the above first interconnection on the above interlayer insulating film, wherein a plurality of second interconnections are densely disposed in a state disconnected from the above gate electrode and the above semiconductor substrate above and below the above interlayer insulating film and electrically floating; a conductive layer formed in a second region of the above semiconductor substrate; and a third interconnection formed in proximity to the above floating interconnection region on the above interlayer insulating film and connected to the conductive layer in the second region of the above semiconductor substrate.

With the arrangement, even when a photoresist film as a mask on the second interconnection in the floating interconnection region is charged while the individual interconnections are formed, charges move to the semiconductor substrate via the third interconnection connected to the conductive layer of the semiconductor substrate. Consequently, an increase in the amount of charges accumulated in the first interconnection and in the gate electrode caused by the floating interconnection region present adjacently is suppressed so that the amount of charges injected into the gate insulating film is reduced. Therefore, the degradation of the characteristics of the MIS transistor including the amount of shift in threshold can be suppressed.

The above second MIS device can also be embodied in preferred forms similar to those embodying the above first MIS device.

Additionally, in the above second MIS device, when a total area occupied by a gate insulating film of the above MIS transistor is S $\mu$m$^2$ and a height of the above first interconnection connected to the gate electrode of the above MIS transistor is H $\mu$m, a length of each of the above second interconnections may be 15×S/H $\mu$m or more.

Alternatively, in the above second MIS device, a total area occupied by all of the above second interconnections may account for 40% or more of an area of the above floating interconnection region.

In these cases, the presence of the floating interconnection region may seriously affect the amount of charges accumulated in the first interconnection. However, the amount of charges accumulated in the first interconnection can also be reduced by using the arrangement of the second MIS device of the present invention.

To achieve the above third object, when the above MIS transistors and the above first interconnections are disposed at a plurality of positions in the above first MIS device, all of the above interconnections may be disposed such that a spacing between each adjacent two of all of the above interconnections is substantially equal for each of the above MIS transistors.

The arrangement eliminates variations in the amount of charges injected into the gate insulating films caused in the presence or absence of the floating interconnection regions in a region contiguous to the first interconnections connected to the gate electrodes and achieves equal amounts of charges injected into the gate insulating films. In short, variations in the characteristics of the MIS transistors in the MIS device can be reduced and hence the overall characteristics of the MIS device can be improved.

To achieve the above fourth object, there is provided a method of diagnosing a MIS device by judging, at a stage of designing the MIS device in which a large number of MIS transistors and multilayer interconnections are formed on a semiconductor substrate, whether or not characteristics of each of the above MIS transistors are proper, the above method comprising: a first step of extracting groups of interconnections independent of each other in a given interconnect layer from data on a layout of the above interconnections; a second step of classifying, depending on the states of connection with the above semiconductor substrate, the above independent groups of interconnections under a first group of interconnections connected to gate electrodes of the respective MIS transistors, a second group of interconnections each providing resistor connection or rectifier connection with the above semiconductor substrate, and a third group of interconnections belonging neither to the above first group of interconnections nor to the above second group of interconnections; a third step of expanding a region of the above second group of interconnections by a specified distance and inverting a result of expansion to obtain a first region; a fourth step of extracting, from regions of the above third group of interconnections, one at an occupation ratio of 40% or more; a fifth step of performing a logical product between the above first region and the above second region to obtain a third region; a sixth step of performing respective logical products between the above first group of interconnections and the above third region; and a seventh step of comparing each of the logical products obtained in the above sixth step with a predetermined normal value to judge, if any one of the logical products is equal to or more than the above normal value, the characteristics of each of the above MIS transistors to be proper.

In the above method of diagnosing a MIS device, the independent groups of interconnections may be discerned based on the presence or absence of a buried layer between a given interconnect layer and an underlying interconnect layer thereof in the above first step.

With the arrangement, it becomes possible to judge whether or not the state of interconnection is proper based on the situation around the first interconnection connected to the gate electrode at the stage of designing placement and routing for the MIS device. Consequently, the MIS device with excellent characteristics can be manufactured.

To achieve the above first to third objects, the present invention has also proposed manufacturing methods for implementing the arrangements of the above first to third MIS devices, which will be described specifically below.

A first method of manufacturing a MIS device comprises: a first step of forming a MIS transistor having a gate insulating film, a gate electrode, and source/drain regions in a first region of a semiconductor substrate; a second step of forming a conductive layer in a second region of the above semiconductor substrate; a third step of forming an interlayer insulating film above the above semiconductor substrate; a fourth step of forming a first connection hole extending through the above interlayer insulating film and reaching the above gate electrode and a second connection hole extending at least through the above interlayer insulating film and reaching the above conductive layer; a fifth step of forming a first buried layer filled in the above first connection hole and a second buried layer filled in the above second connection hole; a sixth step of depositing, on the above interlayer insulating film, a conductive film in contact with the above first and second buried layers; a seventh step of forming, on the above conductive film, a photoresist film covering a region in which interconnections are to be formed; and an eighth step of forming a first interconnection connected to the above first buried layer and a second interconnection connected to the above second buried layer and located in proximity to the above first interconnection by selectively removing the above conductive film by dry etching using the above photoresist film as a mask.

A second method of manufacturing a MIS device of the present invention comprises: a first step of forming a MIS transistor having a gate insulating film, a gate electrode, and source/drain regions in a first region of a semiconductor substrate; a second step of forming a conductive layer in a second region of the above semiconductor substrate; a third step of forming an interlayer insulating film above the above semiconductor substrate; a fourth step of forming a first connection hole extending through the above interlayer insulating film and reaching the above gate electrode and a second connection hole extending at least through the above interlayer insulating film and reaching the above conductive layer; a fifth step of forming a first buried layer filled in the above first connection hole and a second buried layer filled in the above second connection hole; a sixth step of depositing, on the above interlayer insulating film, a conductive film in contact with the above first and second buried layers; a seventh step of forming, on the above conductive film, a photoresist film covering a region in which interconnections are to be formed; and an eighth step of forming a first interconnection connected to the above first buried layer, a floating interconnection region in which a plurality of second interconnections are densely disposed in a state disconnected from the above gate electrode and the above semiconductor substrate and electrically floating, and a third interconnection connected to the above second buried layer by selectively removing the above conductive film by dry etching using the above photoresist film as a mask such that the above first and third interconnections are located in proximity to the above floating interconnection region.

A third method of manufacturing a MIS device of the present invention includes forming a plurality of MIS transistors in the above first step and forming the above individual interconnections in the above eighth step such that a spacing between each adjacent two of all of the above interconnections is substantially equal for each of the above MIS transistors.

The above first and second methods of manufacturing a MIS device can also be embodied in preferred forms for embodying the above first and second MIS devices.

DETAILED DESCRIPTION OF THE INVENTION (First Embodiment)

Figure 1:
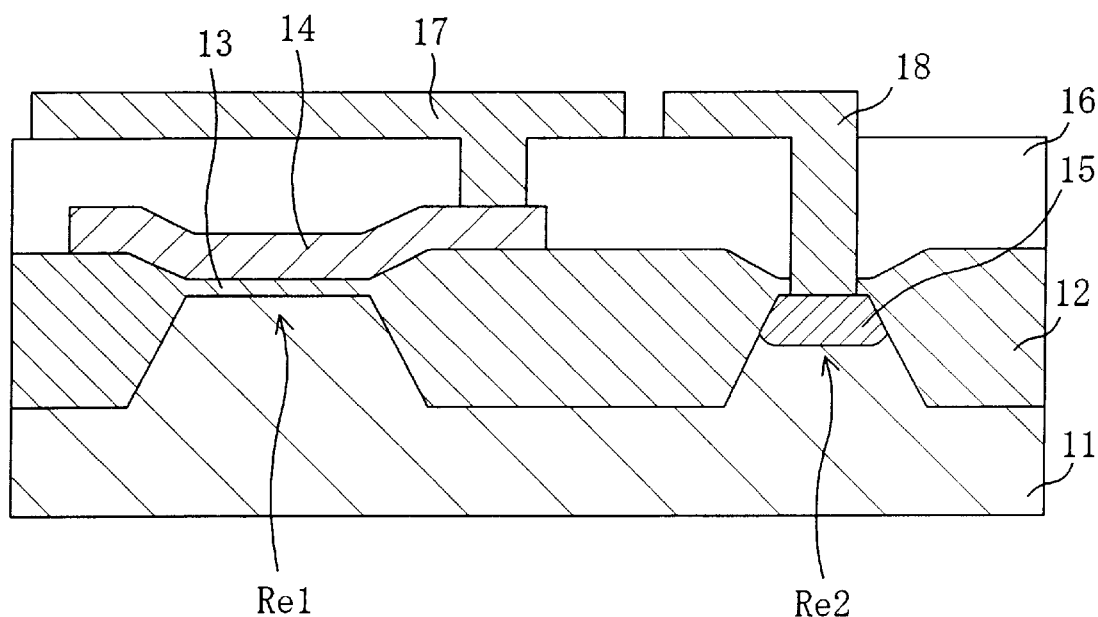
FIG. 1 is a cross-sectional view of a MOS device according to a first embodiment.
Figure 2:
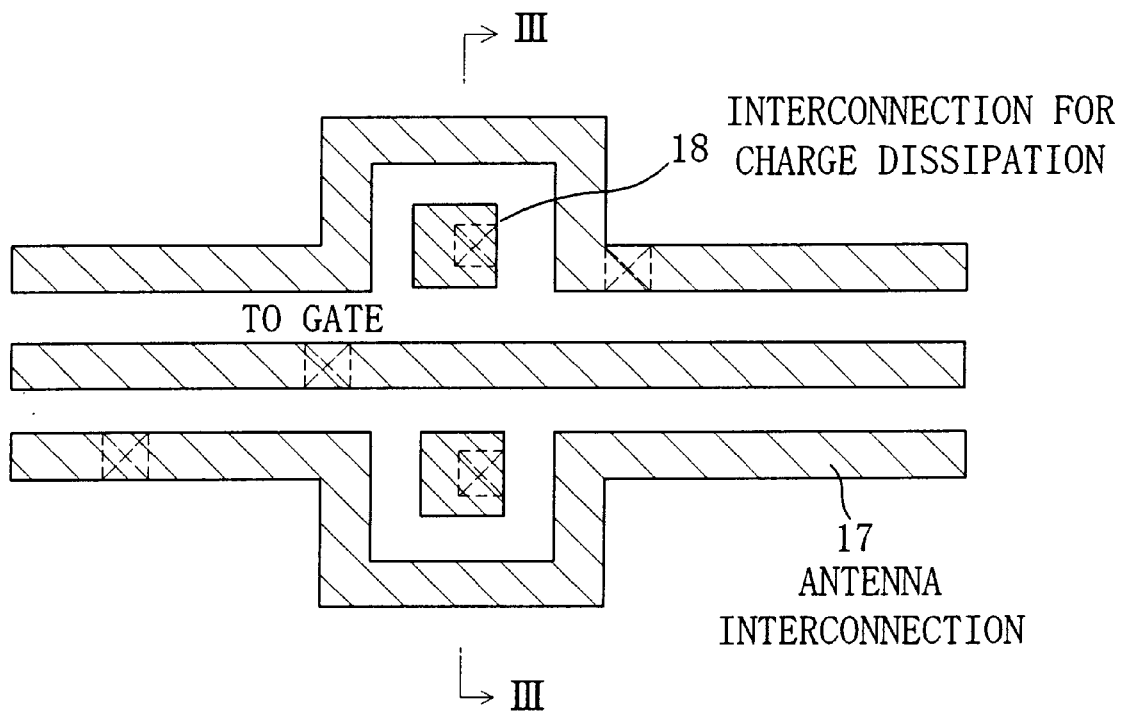
FIG. 2 is a plan view of the MOS device according to the first embodiment.
Figure 3:
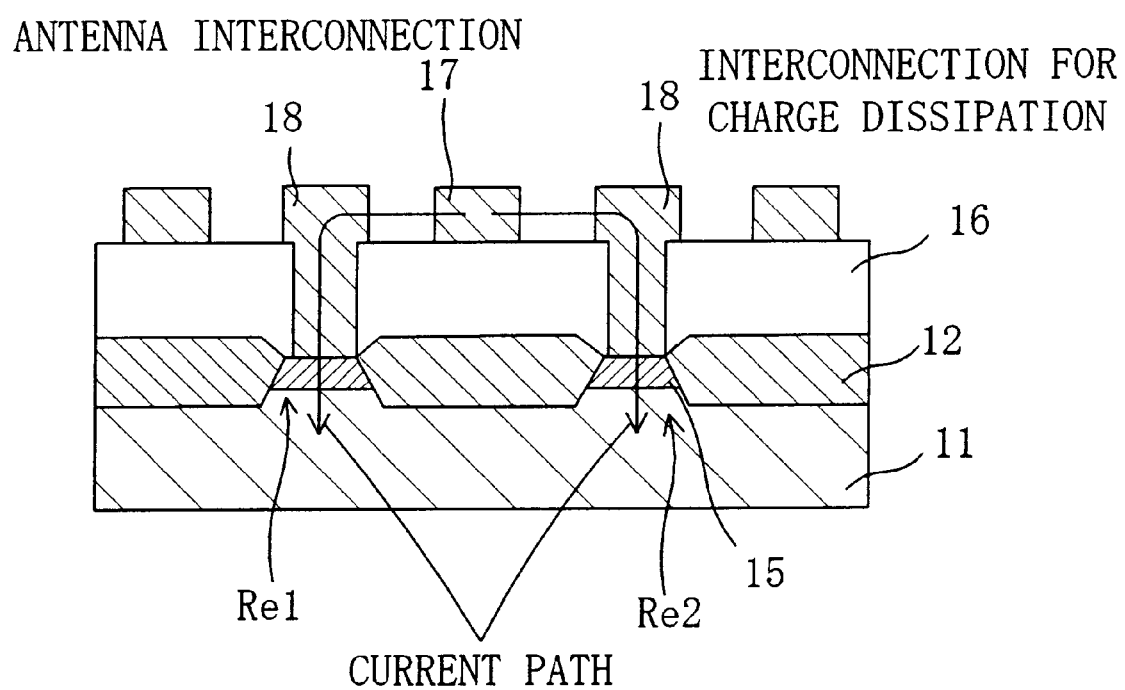
FIG. 3 is a cross-sectional view taken along the line III—III of FIG. 2 showing the MOS device according to the first embodiment.

FIG. 1 is a cross-sectional view of a p-channel MOS transistor portion in a first embodiment. FIG. 2 is a plan view of the p-channel MOS transistor portion corresponding to FIG. 1. FIG. 3 is a cross-sectional view taken along the line III—III of FIG. 2.

As shown in FIG. 1, a LOCOS film 12 for isolating individual semiconductor elements is formed on an n-type semiconductor substrate 11. A gate oxide film 13 is formed on the semiconductor substrate 11 in first and second regions Re1 and Re2 surrounded by the LOCOS film 12. A gate electrode 14 is formed over the gate oxide film 13 in the first region Re1 and the LOCOS film 12. Thus, the semiconductor substrate 11, the gate oxide film 13, and the gate electrode 14 constitute a MOS capacitor in the first region Re1. On the other hand, a p-type impurity diffusion layer 15 is formed in the second region Re2 by implanting a p-type impurity into the semiconductor substrate 11. An interlayer insulating film 16 is formed on the gate electrode 14. An antenna interconnection 17 as a first metal interconnection and an interconnection for charge dissipation 18 as a second metal interconnection are formed on the interlayer insulating film 16. The antenna interconnection 17 is connected to the gate electrode 14 by filling up a connection hole bored in the interlayer insulating film 16. The interconnection for charge dissipation 18 is connected to the p-type impurity diffusion layer 15 in the second region Re2 by filling up another connection hole bored in the interlayer insulating film 16 and gate oxide film 13.

As shown in FIG. 2, the above interconnection for charge dissipation 18 is formed by utilizing a space between the two adjacent antenna interconnections 17, so that the provision of the interconnection for charge dissipation 18 does not increase the area occupied by the semiconductor device.

On a vertical cross-sectional plane orthogonal to the cross section shown in FIG. 1, p-type impurity diffusion layers (not shown) as source/drain regions are formed at a high concentration in the first region Re1 of the semiconductor substrate 11 on both sides of the gate electrode 14, so as to form a p-channel MOS transistor (field-effect transistor).

A description will now be given to the process of manufacturing the p-channel MOS transistor thus constructed.

First, the LOCOS film 12 is formed by selectively oxidizing a surface of the n-type semiconductor substrate 11, followed by the formation of the gate oxide film 13 surrounded by the LOCOS film 12. Then, a polysilicon film is deposited and patterned to form the gate electrode 14. Subsequently, the interlayer insulating film 16 is formed on the substrate, followed by the boring of the interlayer insulating film 16 and the gate oxide film 13 to form the connection hole reaching the gate electrode 14 and the connection hole reaching the n-type diffusion layer 15. Thereafter, a metal film (e.g., an aluminum alloy film) is deposited to fill up each of the connection holes and extend over the interlayer insulating film 16 and then is selectively removed by dry etching to form the first interconnection 17 and the interconnection for charge dissipation 18.

In the process step of performing dry etching with respect to the metal film, the following action is observed. That is, the collision of ions from a plasma region produced above the substrate and the generation of charges accompanying the removal of the metal film accumulate the charges in the metal film being removed. Over-etching is performed during a given period of time after the removal of the metal film is complete to inject the charges into the metal film. As a result, the antenna interconnection 17 is electrically floating at the completion of the metal film so that the voltage between the gate electrode 14 connected to the antenna interconnection 17 and the semiconductor substrate 11 is increased. Accordingly, the charges in the gate electrode 14 are injected into the gate oxide film 13, which degrades the quality of the gate oxide film 13.

In the present embodiment, however, the interconnection for charge dissipation 18 is formed contiguous to the antenna interconnection 17 and connected to the p-type diffusion layer 15 in the semiconductor substrate 11, so that it is not in the floating state. Moreover, the antenna interconnection 17 and the interconnection for charge dissipation 18 are connected in parallel relative to the plasma region. Consequently, when the voltage between the antenna interconnection 17 and the semiconductor substrate 11 is increased, substantially all the charges from the plasma region are allowed to flow to the semiconductor substrate 11 through the interconnection for charge dissipation 18. Moreover, since the interconnection for charge dissipation 18 is contiguous to the antenna interconnection 17, the charges accumulated in the antenna interconnection 17 are liable to move to the interconnection for charge dissipation 18. As a result, a current path as shown in FIG. 3 is produced. Consequently, it becomes possible to reduce the amount of charges injected into the gate oxide film 13 and suppress the deterioration of the gate oxide film 13.

Figure 4:
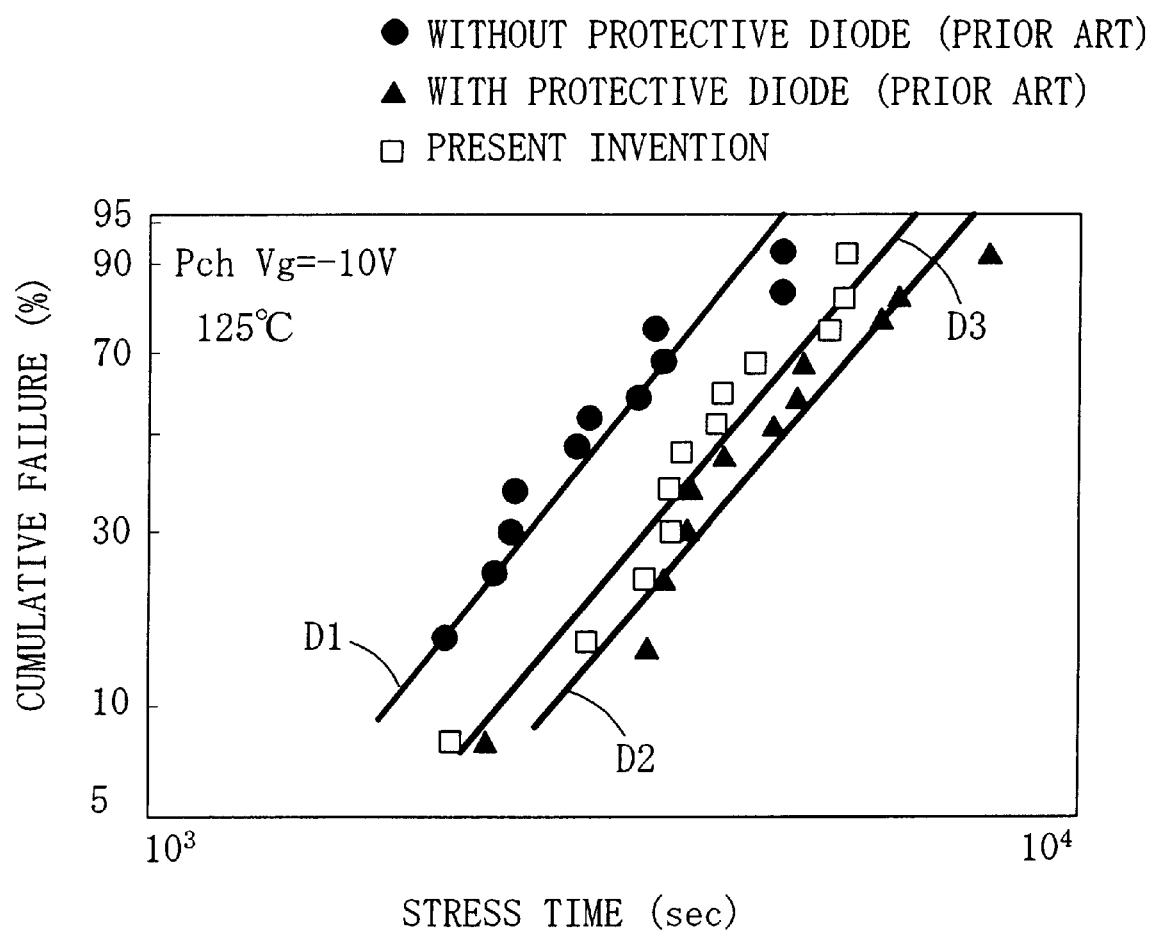
FIG. 4 shows the TDDB property of the gate oxide film of a MOS transistor according to the first embodiment.

FIG. 4 shows for comparison the conventional method and the method of the present embodiment in relation to the TDDB voltage-resistant property of a gate oxide film, specifically the stress time versus the amount of cumulative failure (%). In the drawing, each of the straight lines D1 to D3 represents a relationship between the stress time and the amount of cumulative failure obtained from measurement data by the method of least square. The straight lines D1, D2, and D3 indicate the respective voltage-resistant properties of the gate oxide films in the conventional embodiment without a protective diode, in the conventional embodiment with the protective diode, and in the present embodiment. As for a sample provided with the protective diode in the conventional embodiment, it is composed of the antenna interconnections connected directly to the substrate shown in FIG. 14. As shown in FIG. 4, the sample of the present invention (see the straight line D3) provides reliability as high as that of the sample with the protective diode of the conventional embodiment (see the straight line D2), in contrast to the sample with no protective measure taken against an antenna effect of the conventional embodiment (see the straight line D1).

Figure 14:
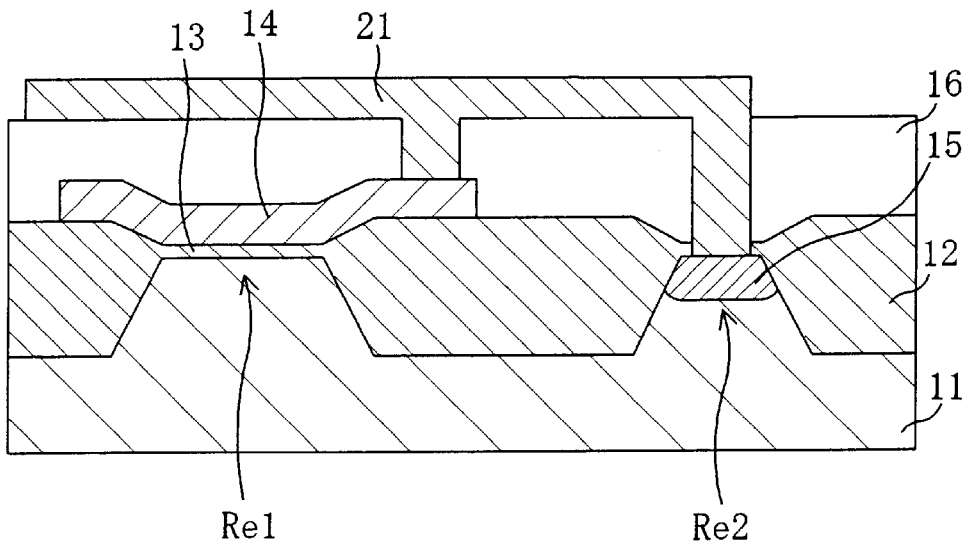
FIG. 14 is a cross-sectional view of a conventional MOS device.
Figure 15:
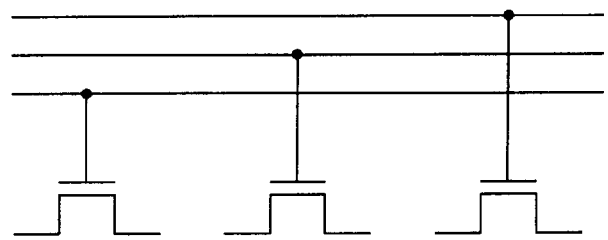
FIG. 15 is a circuit diagram of the conventional MOS device.
Figure 16:
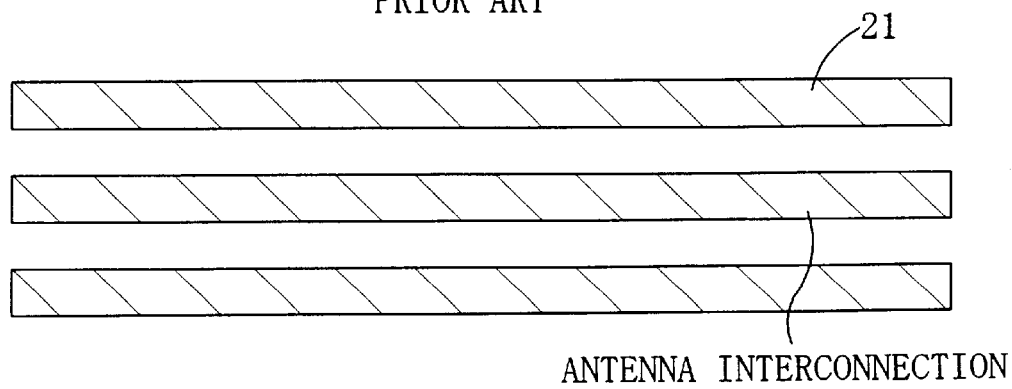
FIG. 16 is a plan view of the conventional MOS device.
Figure 17A:
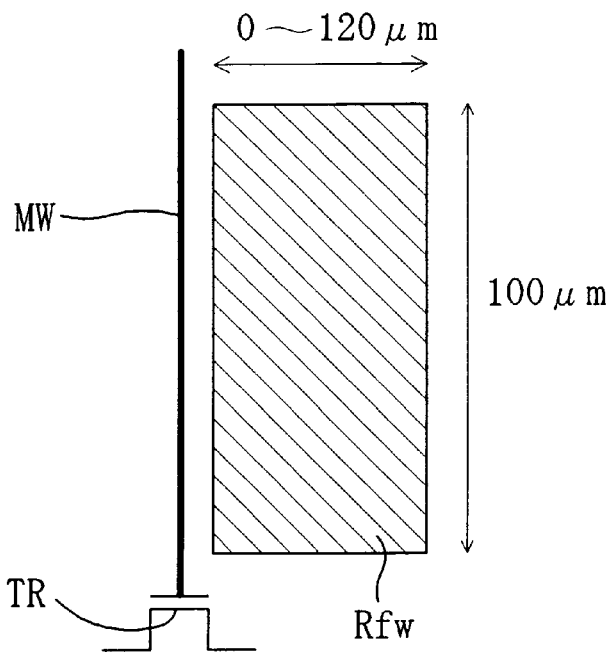
FIG. 17(a) is a plan view showing a conventional embodiment in which a floating interconnection region is present around the gate electrode and FIG. 17(b) shows data indicating shifts in threshold with respect to the width of the floating interconnection region.
Figure 17B:
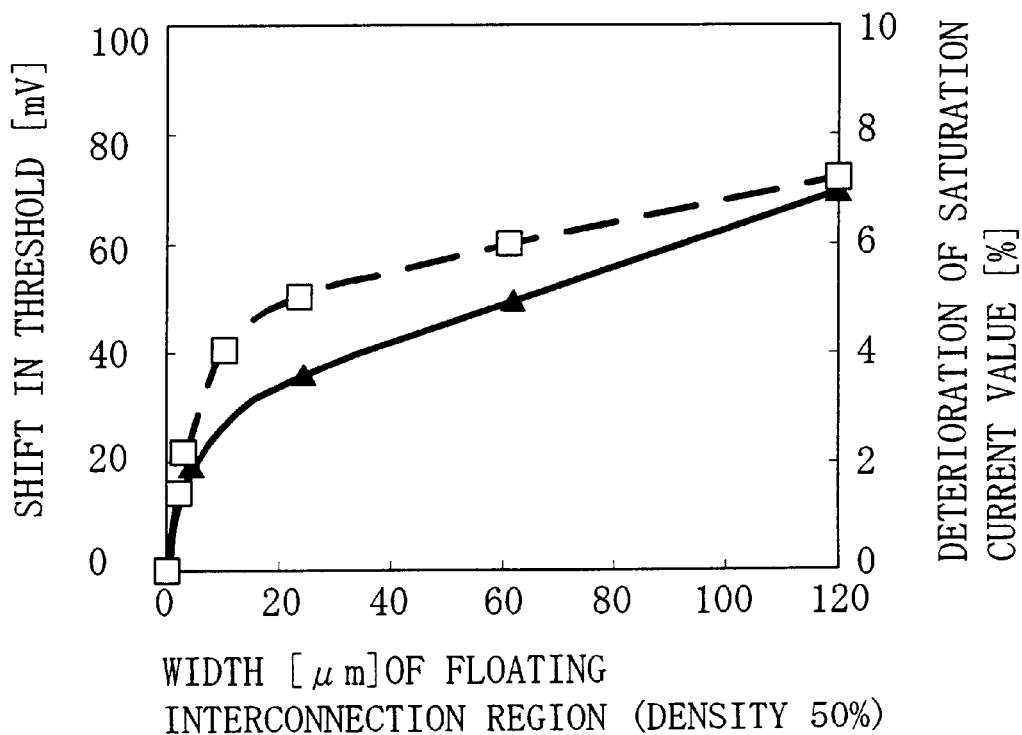
Figure 18A:
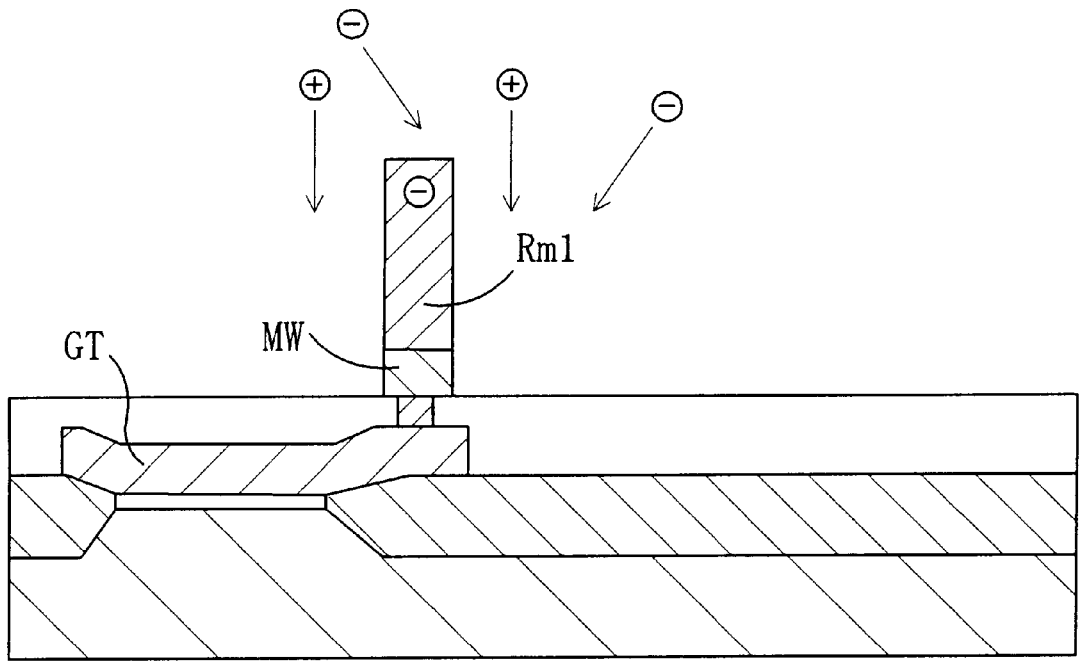
FIGS. 18(a) and 18(b) are cross-sectional views for illustrating an increased amount of charges used by the photoresist film on the floating interconnection region to charge up the contiguous photoresist film on the antenna interconnection in the conventional MOS device.
Figure 18B:
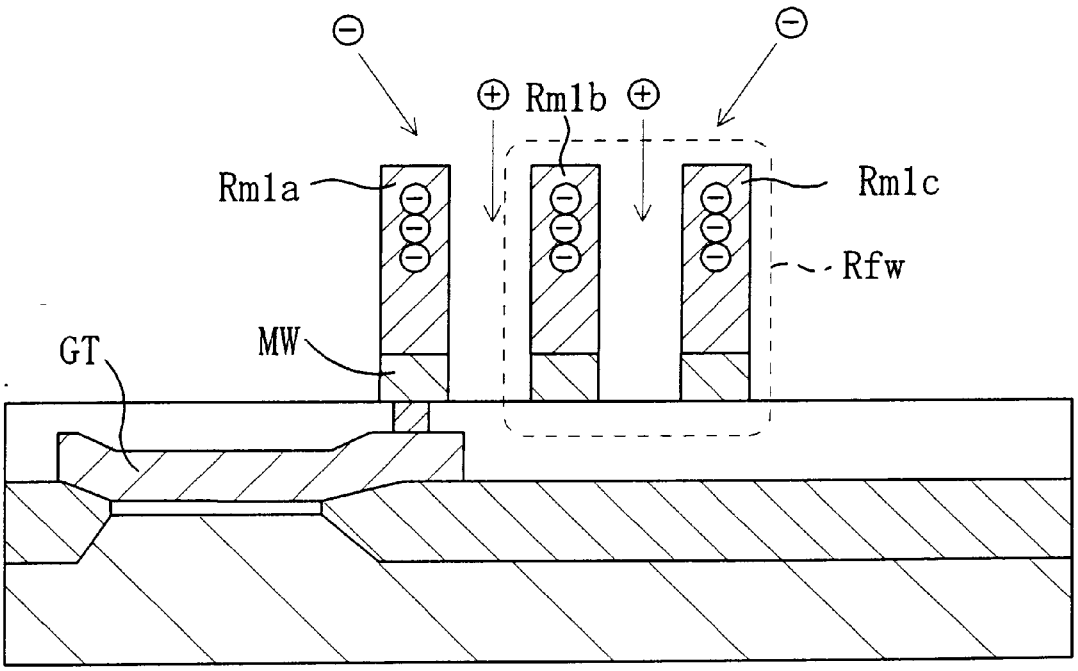

Thus, according to the present embodiment, the interconnection for charge dissipation 18 connected to the ground is provided on the semiconductor substrate 11 to be contiguous to the antenna interconnection 17, so that charges injected from the plasma region into the antenna interconnection 17 are allowed to flow to the semiconductor substrate 11 via the interconnection for charge dissipation 18 during the dry-etching process for patterning the metal film, which reduces the amount of charges injected into the gate electrode 14. Consequently, it becomes possible to prevent occurrence of a damage in the gate oxide film 13. Furthermore, since the antenna interconnection 17 and the interconnection for charge dissipation 18 are separated from each other, no parasitic capacity of the antenna interconnection 17 such as a conventional MIS semiconductor device shown in FIG. 14 is increased and no current leakage is affected at protection diode composed of the p-type impurity diffusion layer 15 and a part of the semiconductor substrate 11.

Although some portions of the antenna interconnections 17 in the floating state are configured non-linearly due to the existence of the interconnection for charge dissipation 18, a region sufficiently large to allow the formation of the curved portions can surely be obtained.

(Second Embodiment)

Figure 5A:
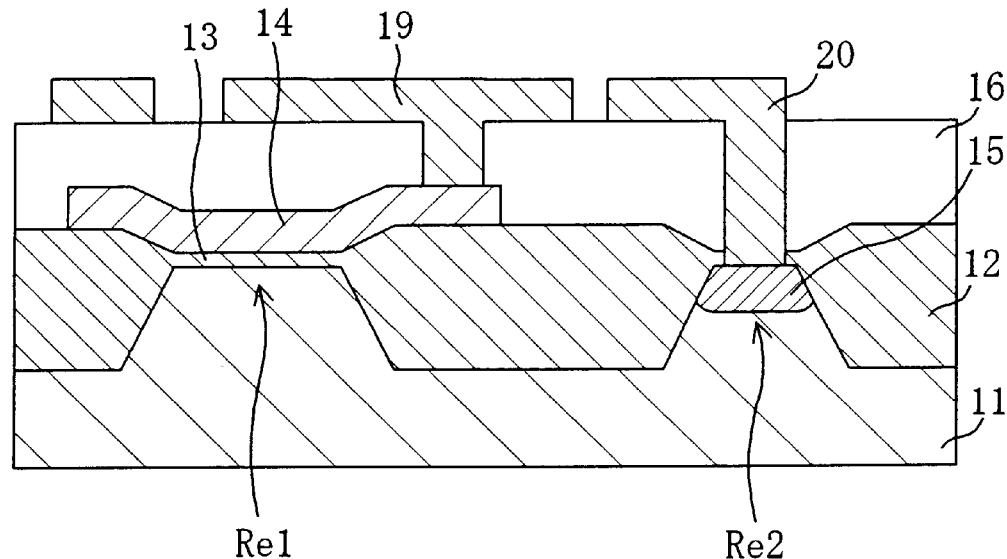
FIGS. 5(a) and 5(b) are cross-sectional and plan views of a MOS device according to a second embodiment, respectively.
Figure 5B:
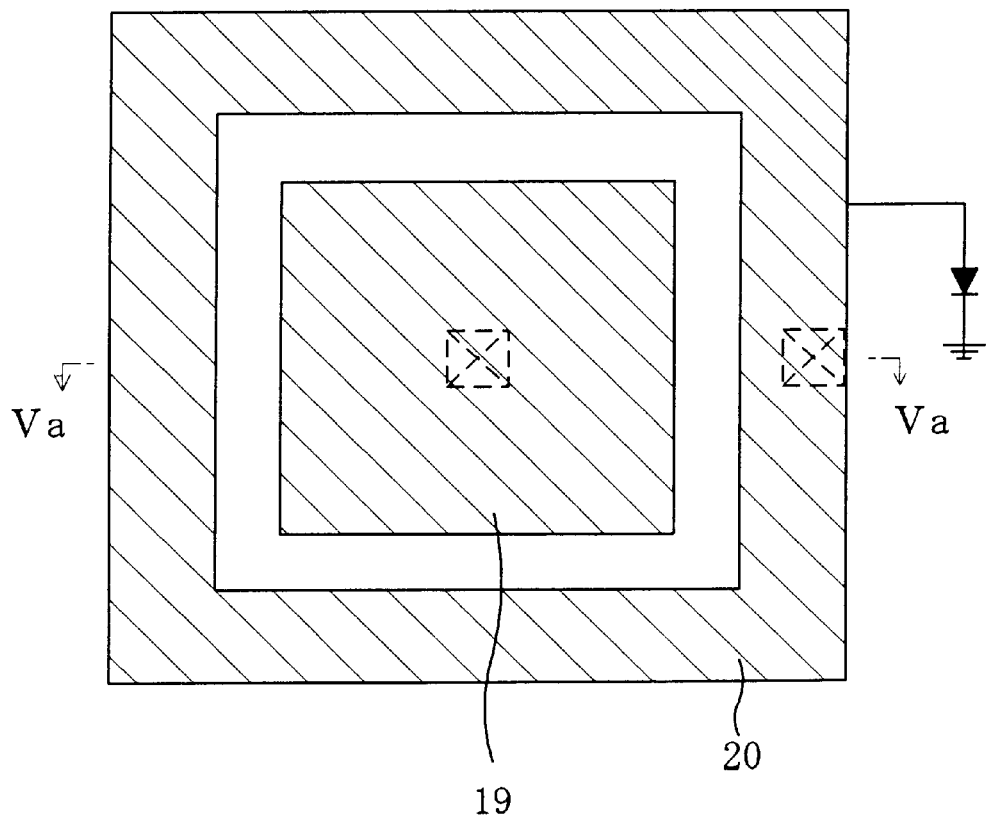

Next, a second embodiment will be described with reference to FIGS. 5(a) and 5(b). FIG. 5(a) is a cross-sectional view of a p-channel MOS transistor according to the second embodiment. FIG. 5(b) is a plan view corresponding to FIG. 5(a).

As shown in the drawings, a roughly square external pad 19 and an interconnection for charge dissipation 20 in the form of a closed square ring surrounding the external pad 19 are formed respectively as the first and second metal interconnections on the interlayer insulating film 16 in the present embodiment. The above external pad 19 is connected to a gate electrode 14, while the above interconnection for charge dissipation 20 is connected to a p-type impurity diffusion layer 15. As for the other components, they have the same structures as those used in the semiconductor device according to the first embodiment shown in FIG. 1.

If the semiconductor device having the external pad 19 of the present embodiment is used in the conventional structure, a damage to the oxide film caused by the antenna effect will be considerably large, since the external pad 19 occupies a large area. In the present embodiment, however, charges from the plasma region are allowed to flow into the semiconductor substrate 11 via the interconnection for charge dissipation 20 during the dry-etching process for forming the external pad 19 by the same action described in the above first embodiment, resulting in a reduction in the amount of charges injected into the gate electrode 14 connected to the external pad 19. The charges accumulated in the external pad 19 are dissipated to the semiconductor substrate 11 via the interconnection for charge dissipation 20, which suppresses the antenna effect, provides a path for charges injected from the outside, and effectively prevents the occurrence of a damage in the gate oxide film.

Although the mechanism of the current path from the antenna interconnection or external pad to the interconnection for charge dissipation has not been elucidated in the first and second embodiments, the results of experiments guarantee the presence of the current path. In particular, since a larger effect is achieved accordingly when the spacing between the interconnection for charge dissipation and the antenna or the spacing between the interconnection for charge dissipation and the external pad is smaller, the presence of a path formed by the remainder of etching or a leakage via a surface of the interlayer insulating film between the two interconnections may be assumed. Based on the assumption, it has experimentally been confirmed that, as long as the spacing between the antenna interconnection or external pad and the interconnection for charge dissipation is 1 μm or less, the effect of moving charges from the antenna interconnection or external pad to the interconnection for charge dissipation is also large in performing over-etching after the individual interconnections were formed completely and separated from each other. However, since the ability to dissipate charges is higher as the spacing is smaller, remarkable effects can be exerted by reducing the spacing to a value within a range of the minimum design rule to the limit of resolution in consideration of the present tendency toward a further reduction in the design rules for MIS transistors.

Although the p-channel MOS transistor has been used as an example in the first and second embodiments, similar effects can be obtained with the use of an n-channel MOS transistor. Although the p-type impurity diffusion layer is formed in a region to which the interconnection for charge dissipation is connected to constitute the diode in conjunction with the n-type semiconductor substrate, the interconnection for charge dissipation may be connected directly to the n-type semiconductor substrate.

Although it is not necessarily required in the above first and second embodiments to simultaneously form the antenna interconnection or external pad and the interconnection for charge dissipation from the same material in the same step, manufacturing cost can be reduced if they are formed simultaneously as in the above embodiments.

(Third Embodiment)

Next, a third embodiment will be described with reference to FIGS. 6 to 9.

Figure 6A:
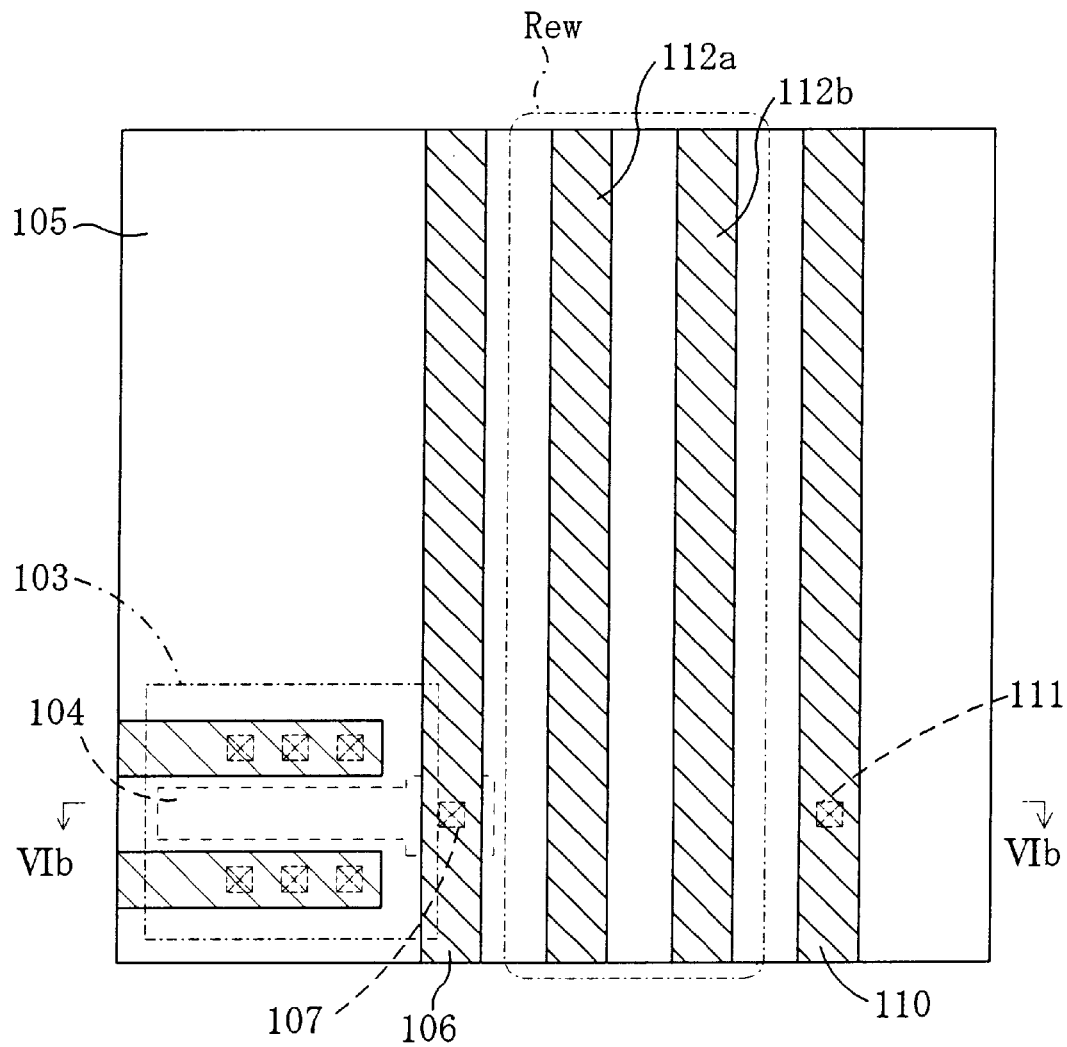
FIGS. 6(a) and 6(b) are plan-view and cross-sectional views of a MOS device according to a third embodiment, respectively.
Figure 6B:
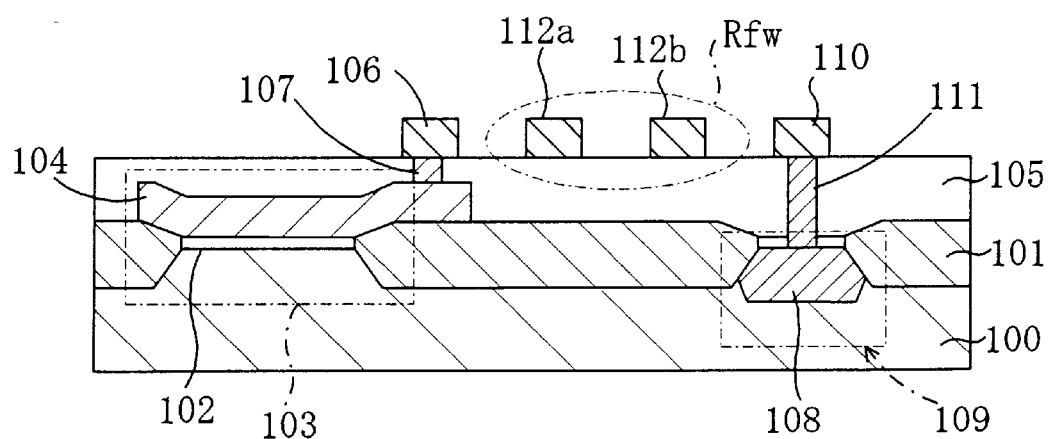

FIG. 6(a) is a plan view of a semiconductor device according to the third embodiment. FIG. 6(b) is a cross-sectional view of the semiconductor device taken along the line VIb—VIb of FIG. 6(b).

In FIGS. 6(a) and 6(b) are shown: a LOCOS film 101 formed on a p-type semiconductor substrate 100; a gate oxide film 102 composing an n-type MOS transistor 103; a gate electrode 104; an interlayer insulating film 105 formed on the semiconductor substrate 100; and an n-type impurity diffusion layer 108 formed on the semiconductor substrate 100. On the interlayer insulating film 105, there are formed: an antenna interconnection 106 as the first metal interconnection connected to the gate electrode via a contact plug 107; an interconnection for charge dissipation 110 as the third metal interconnection connected to the n-type impurity diffusion layer via a contact plug 111; and two floating interconnections 112a and 112b as a second metal interconnection formed between the antenna interconnection and the interconnection for charge dissipation and electrically insulated from any member at this stage (the floating interconnections 112a and 112b may be connected to an upper interconnect layer). The above two floating interconnections 112a and 112b constitute a floating interconnection region Rfw in which the floating interconnections are densely disposed. Each of the interconnections 106, 112a, 112b, and 110 is linearly formed and the individual interconnections are arranged in parallel to each other to form a line-and-space pattern. In the p-type semiconductor substrate 100, a diode 109 is formed by the p-type semiconductor substrate 100 and the n-type impurity diffusion layer 108.

Although the floating interconnection region 112 provided between the antenna interconnection and the interconnection for charge dissipation is constituted by the two floating interconnections 112a and 112b laid out in parallel to each other in the present embodiment, the present invention is also applicable to the case where only one floating interconnection is disposed in the floating interconnection region 112 or three or more floating interconnections are disposed in the floating interconnection region 112.

Next, the process of manufacturing the semiconductor device according to the present embodiment will be described with reference to FIGS. 7(a) to 7(c).

Figure 7A:
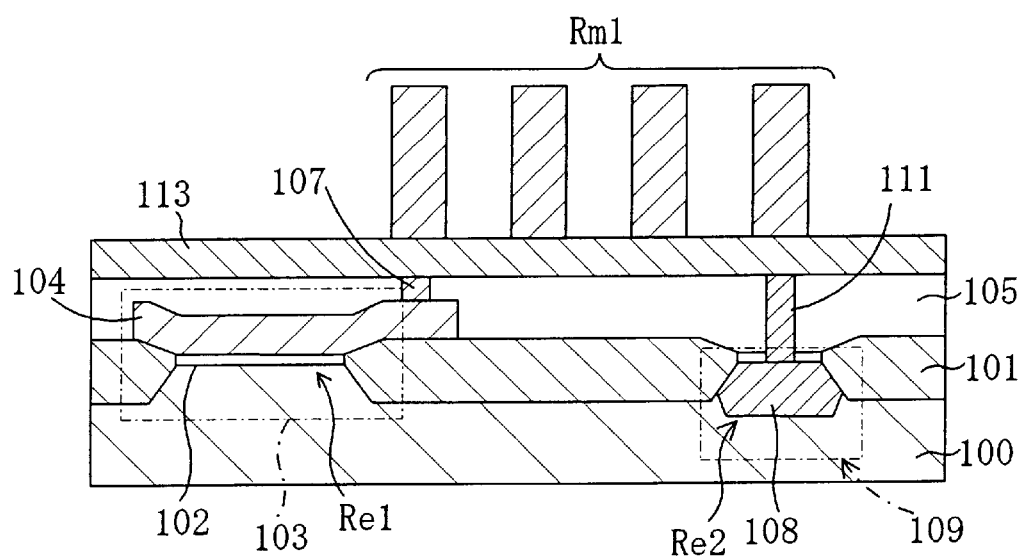
FIG. 7 is a cross-sectional view illustrating the process of manufacturing the MOS device according to the third embodiment.

First, as shown in FIG. 7(a), the LOCOS film 101 is formed on the semiconductor substrate 100 by a well-known method. The gate oxide film 102 is formed on the semiconductor substrate 11 in the first and second regions Re1 and Re2 surrounded by the LOCOS film 101. Thereafter, the formation of the gate electrode 104, the formation of the source/drain regions (not shown) by implanting impurity ions, and the formation of the n-type impurity diffusion layer 108 are sequentially performed, thereby forming a MOS transistor 103 in the first region and forming the diode 109 in the second region Re2. Subsequently, the interlayer insulating film 105 is formed from a silicon dioxide film on the substrate and the contact plugs 107 and 111 are formed by filling connection holes bored in the interlayer insulating film 105 with tungsten or the like. After that, the metal film 113 of an aluminum alloy or the like is deposited over the entire surface, followed by the formation of a photoresist film Rm1 serving as a mask for dry etching on the metal film Rm1.

Figure 7B:
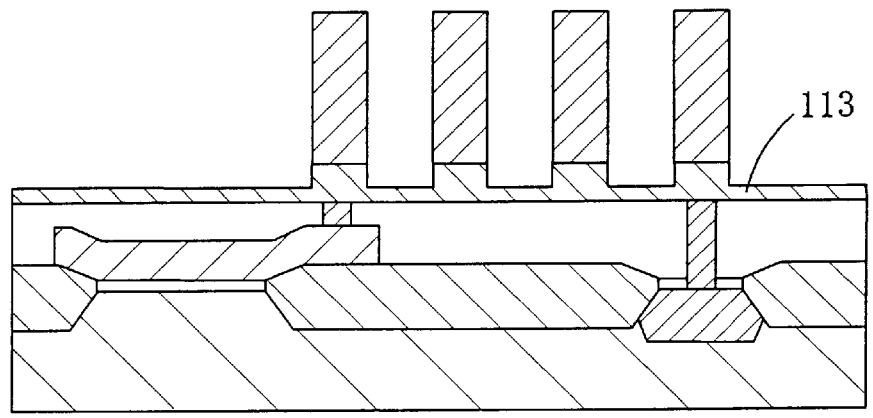

Next, as shown in FIG. 7(b), dry etching is performed using the photoresist mask Rm1 to pattern the metal film 113.

Figure 7C:
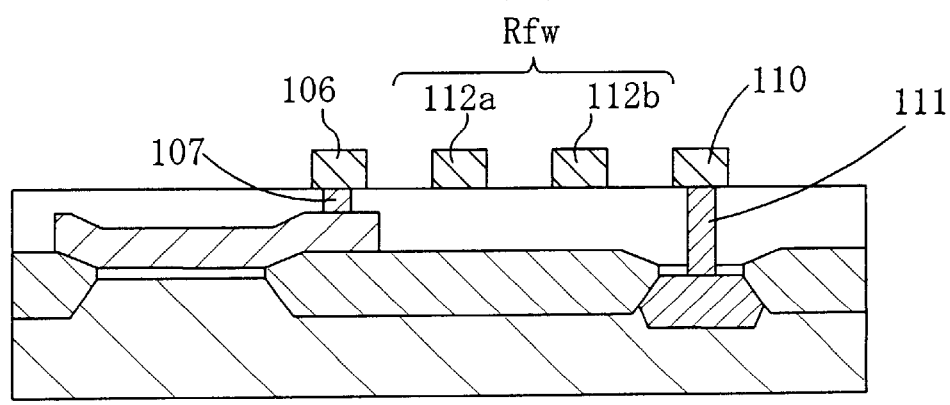

Then, as shown in FIG. 7(c), the antenna interconnection 106 connected to the gate electrode 14 via the contact plug 107, the interconnection 110 for charge dissipation connected to the n-type impurity diffusion layer via the contact plug 111, and the floating interconnections 112a and 112b electrically insulated from any member are sequentially formed on the interlayer insulating film.

In the present embodiment, the degradation of transistor characteristics due to the presence of the floating interconnection region Rfw consisting of the floating interconnections 112a and 112b contiguous to the antenna interconnection 106 connected to the gate electrode can be significantly lessened by the presence of the interconnection for charge dissipation 110 connected to the diode. A description will now be given to the effect of suppressing the deterioration and its reason.

Figure 8A:
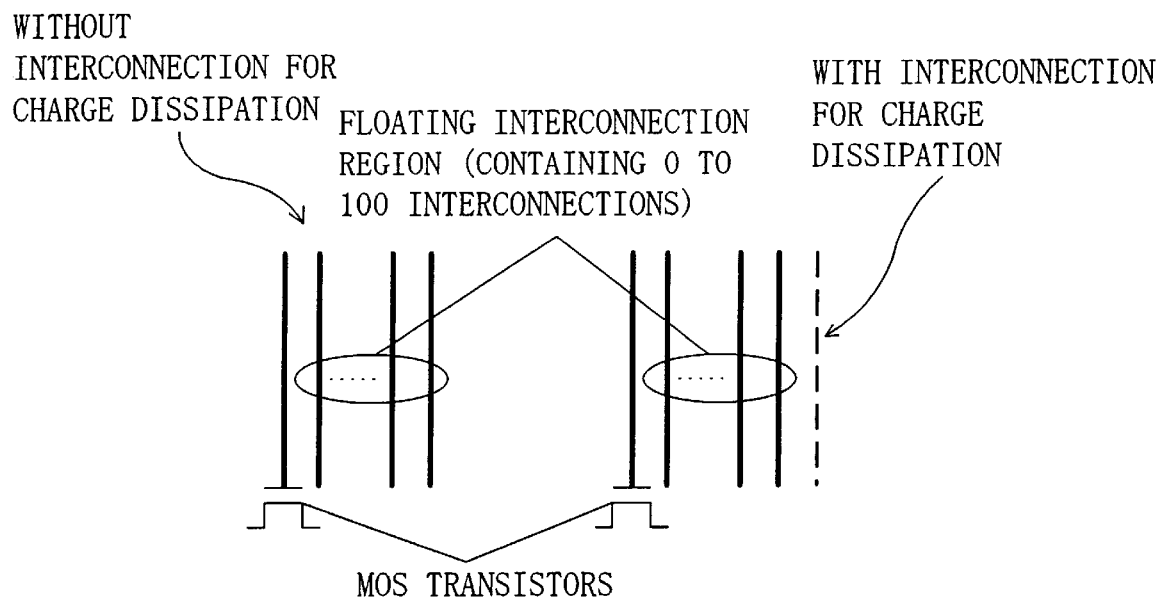
FIG. 8(a) shows a difference in interconnect pattern between a conventional MOS device and the MOS device according to the third embodiment and FIG. 8(b) shows respective shifts in the threshold of a MOS transistor in the conventional MOS device and in the threshold of a MOS transistor in the MOS device according to the third embodiment with respect to the number of interconnections in a floating interconnection region.
Figure 8B:
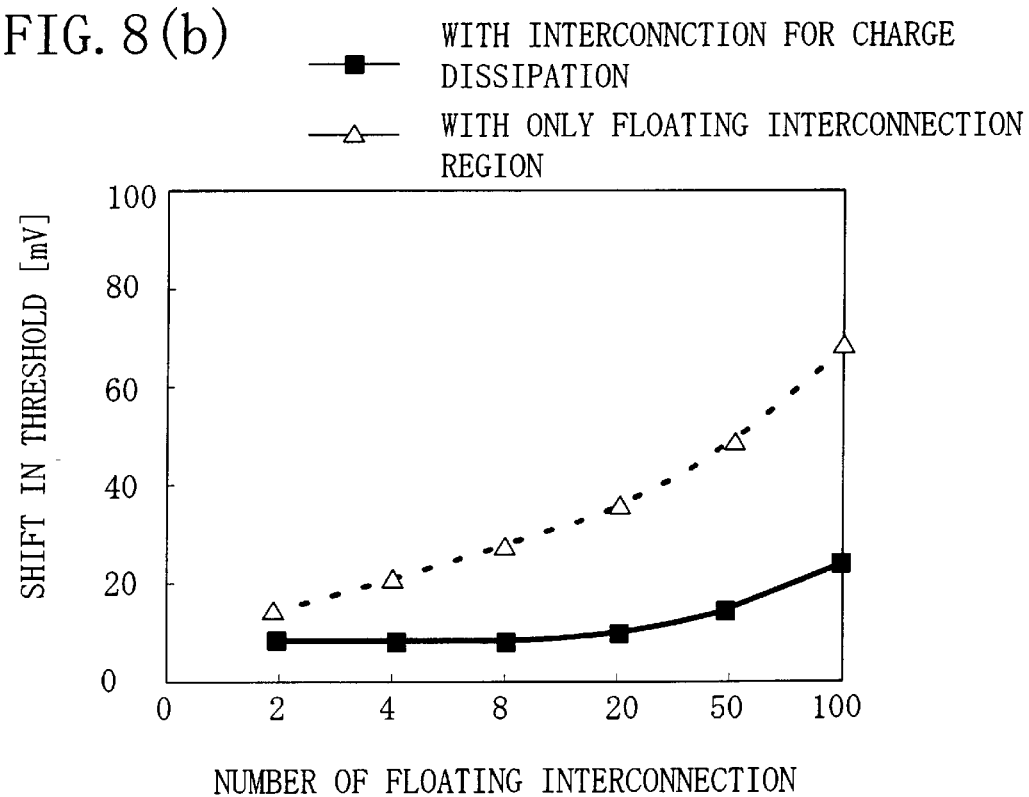

FIG. 8(a) shows interconnect patterns for measuring the amount of degradation incurred by a transistor. FIG. 8(b) shows data on the amount of degradation incurred by the transistor relative to the number of floating interconnections (the amount of shift in threshold) in the case where floating interconnections at an occupation ratio of 50% are present in a floating interconnection region and extend along the metal interconnection connected to the gate electrode (antenna interconnection) over a length of 100 $\mu$m in the interconnect patterns shown in FIG. 8(a). In the floating interconnection region, however, the metal interconnections each having a line width of 0.6 $\mu$m form a line-and-space pattern on a 0.6-$\mu$m spacing (termed 0.6-$\mu$m/0.6-$\mu$m pattern). In the case of providing the interconnection for charge dissipation, the diode is formed in a connecting portion to the interconnection for charge dissipation. As can be understood from FIG. 8(b), the threshold voltage of the transistor varies by 20 mV or more when no interconnection for charge dissipation is provided since four floating interconnections are contiguous to each other (i.e., the floating interconnections at an occupation ratio of 50% are present over a lateral range of 6 $\mu$m). On the other hand, when the interconnection for charge dissipation is provided contiguous to the floating interconnection region, the variation in threshold voltage is limited to 20 mV or less as long as up to fifty floating interconnections are provided contiguous to each other (i.e., floating interconnections at an occupation ratio of 50% are present over a lateral range of 60 $\mu$m). Hence, it may be concluded that the ability to suppress the degradation induced by the floating interconnection region present contiguously to the antenna interconnection connected to the gate electrode is ten times higher with the interconnection for charge dissipation than without the interconnection for charge dissipation.

Figure 9A:
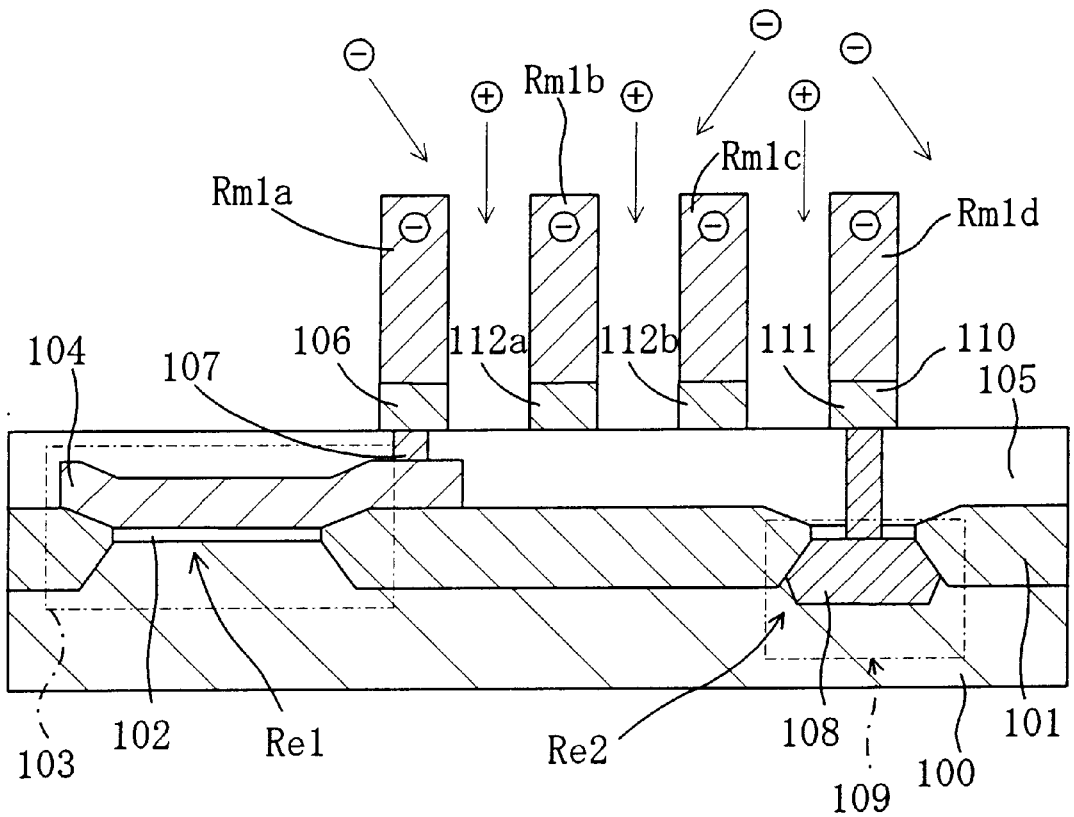
FIGS. 9(a) and 9(b) diagrammatically show the respective amounts of charges used to charge up resists during over-etching process in the MOS device according to the third embodiment and in the conventional MOS device.
Figure 9B:
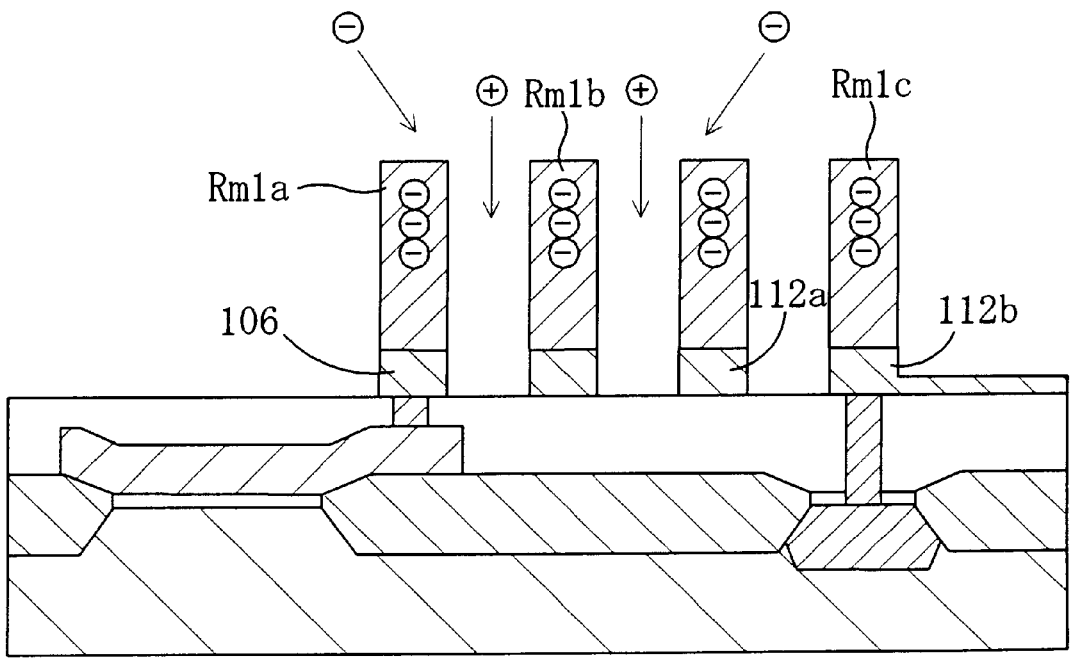

Next, a mechanism whereby the interconnection for charge dissipation reduces the amount of shift in the threshold of the MOS transistor as shown in FIG. 8(b) will be described with reference to FIGS. 9(a) and 9(b). FIG. 9(a) is a cross-sectional view of the semiconductor device according to the present embodiment in which the interconnection for charge dissipation is provided on the side of the floating interconnection region contiguous to the antenna interconnection connected to the gate electrode. FIG. 9(b) is a cross-sectional view of the conventional semiconductor device in which no interconnection for charge dissipation is provided on the side of the floating interconnection region contiguous to the antenna interconnection. FIG. 9(a) shows the process of over-etching performed with photoresist films Rm1a, Rm1b, Rm1c, and Rm1d formed on the respective interconnections 106, 112a, 112b, and 110.

As shown in FIG. 9(a), since the interconnection for charge dissipation 110 connected to the diode 109 is provided in the semiconductor device according to the present embodiment, the remarkable ability to suppress the charging up of the respective photoresist films Rm1a to Rm1c on the antenna interconnection 106 connected to the gate electrode and on the floating interconnections 112a and 112b may be attributed to the following action. That is, even when the photoresist mask Rm1d on the interconnection for charge dissipation 110 connected to the diode 109 is charged up during over-etching, the accumulated charges are allowed to flow into the semiconductor substrate 100 via the diode 109, so that the photoresist film Rm1a will never be charged up. Consequently, the charges generated during dry etching are supplied preferentially to the photoresist film Rm1d on the interconnection for charge dissipation 110 connected to the diode 109 and are barely supplied to the respective photoresist films Rm1b and Rm1c on the floating interconnections 112a and 112b. As a result, the supply of charges from the photoresist films Rm1b and Rm1c on the floating interconnections 112a and 112b to the photoresist film Rm1a on the antenna interconnection 106 is suppressed so that an effective increase in the current from the antenna interconnection 106 to the gate electrode 104 can be prevented positively.

In the conventional semiconductor device, on the other hand, charges are supplied from the plasma region to the photoresist films Rm1b and Rm1c on the floating interconnections 112a and 112b, so that the charges accumulated in the floating interconnections 112a and 112b and in the overlying photoresist films Rm1 and Rm1c are supplied to the gate electrode 104 through the antenna interconnection 106. Hence, the deterioration of the gate oxide film cannot be prevented effectively.

Although the present embodiment has described the case where the floating interconnections are configured as parallel straight lines in the floating interconnection region, the present invention is not limited thereto but is applicable to partially curved floating interconnections since, in that case also, charges accumulated in the floating interconnection region are effectively prevented from being supplied to the gate electrode via the antenna interconnection connected to the gate electrode.

Although the diode is formed in the semiconductor substrate connected to the interconnection for charge dissipation in the present embodiment, the present invention is not limited thereto. The interconnection for charge dissipation may be connected directly to the semiconductor substrate without intervention of the diode.

Although the interconnection for charge dissipation unnecessary for the operation of the integrated circuit is provided in the present embodiment to achieve electrical connection with the semiconductor substrate in the dry-etching step, equal effects can be obtained by disposing interconnections useful for the operation of the integrated circuit such as interconnect patterns connected to the source, drain, and substrate terminal of the transistor.

(Fourth Embodiment)

Figure 10:
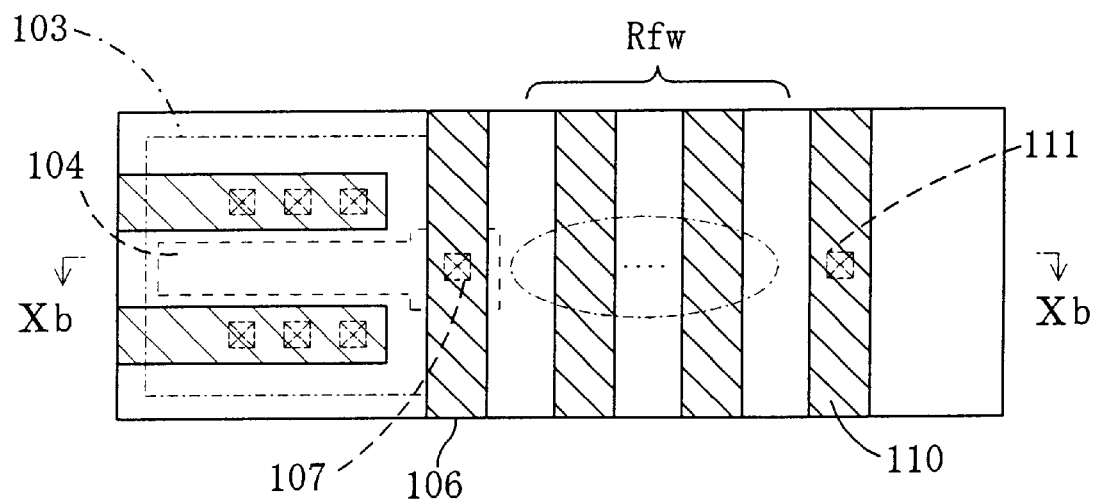
FIGS. 10(a) and 10(b) are plan and cross-sectional views of a MOS device according to a fourth embodiment in a portion in which the floating interconnection region is present in the proximity of an antenna interconnection, respectively.
Figure 10:
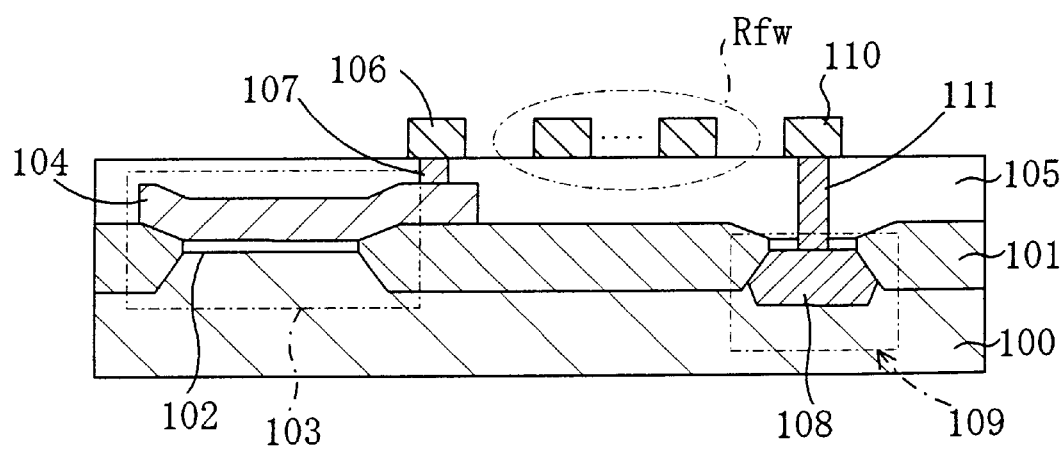
Figure 11A:
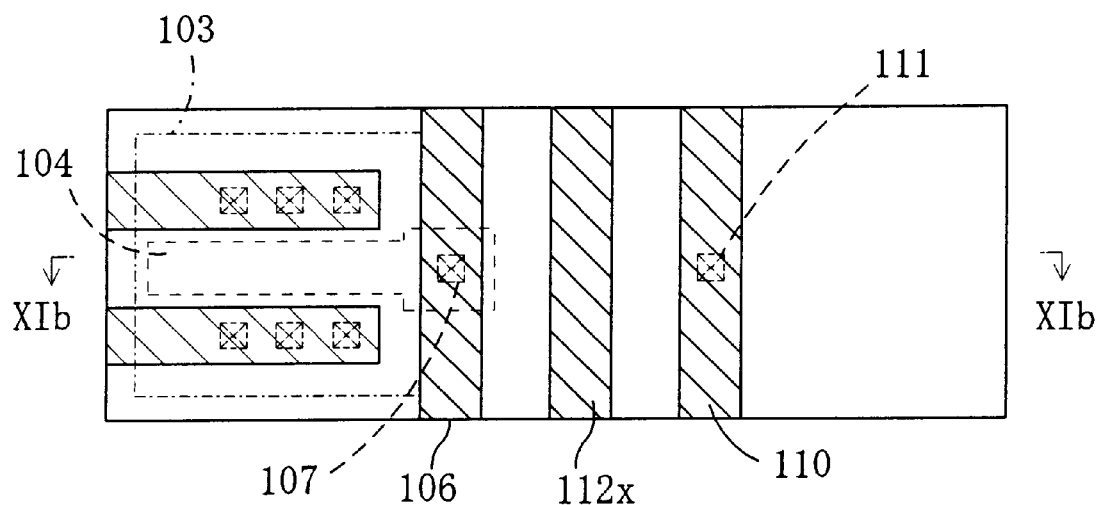
FIGS. 11(a) and 11(b) are plan and cross-sectional views of a MOS device according to the fourth embodiment in a portion in which the floating interconnection region is absent in the proximity of the antenna figure respectively.
Figure 11B:
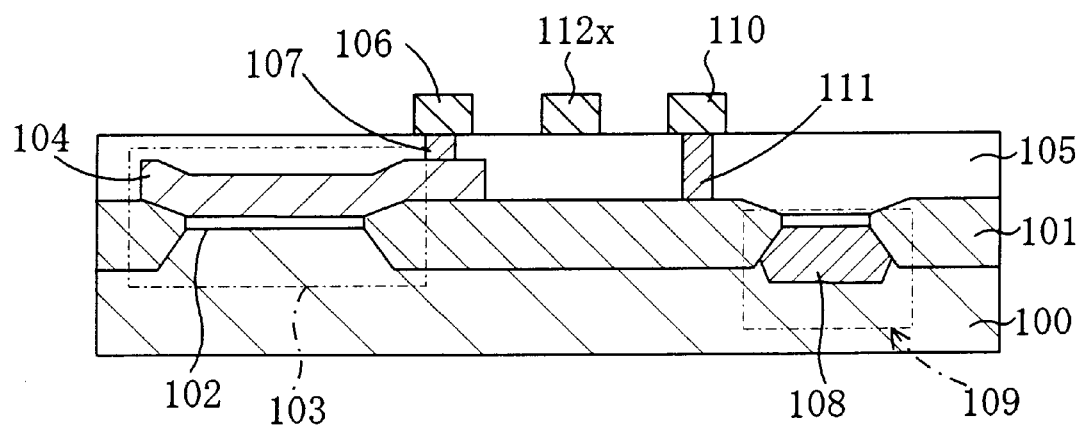

Next, a fourth embodiment will be described with reference to FIGS. 10 and 11. FIG. 10(a) is a plan view showing the structure of a transistor and its vicinity located around the region in which floating interconnections are densely laid out in a semiconductor device according to the fourth embodiment. FIG. 10(b) is a cross-sectional view corresponding to FIG. 10(a). FIG. 11(a) is a plan view showing the structure of a transistor and its vicinity located in a portion in which floating interconnections are laid out coarsely in the semiconductor device according to the fourth embodiment. FIG. 11(b) is a cross-sectional view corresponding to FIG. 11(a).

The advantages of the semiconductor device in the present embodiment over the conventional semiconductor devices will be described below by comparing FIGS. 10(a) and 10(b) and FIGS. 11(a) and 11(b) with FIGS. 19(a) and 19(b) and FIGS. 20(a) and 20(b) which are plan views and cross-sectional views showing the structure of the conventional semiconductor device. In the region shown in FIGS. 19(a) and 19(b) of the conventional embodiment, the antenna interconnection 106 connected to the gate electrode 104 of the transistor 103 is present in the proximity of the region Rfw in which the floating interconnections are laid out densely. The antenna interconnection 106 connected to the gate electrode 104 of the MOS transistor 103 in FIGS. 20(a) and 20(b) is present in the region in which interconnections including floating interconnections are absent or only a few floating interconnections are laid out coarsely. Although only the floating interconnections on both ends are shown in the floating interconnection region Rfw of FIGS. 11(a) and 11(b) and FIGS. 20(a) and 20(b) for the sake of clarity, the following description assumes the case where a large number of floating interconnections are disposed.

Figure 19A:
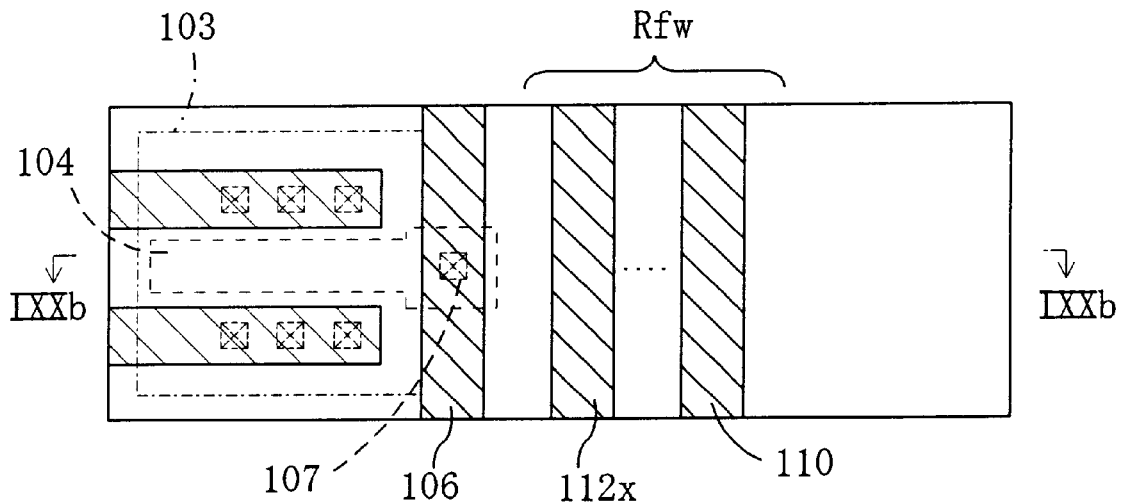
FIGS. 19(a) and 19(b) are plan and cross-sectional views of the conventional MOS device in a portion in which the floating interconnection region is present in the proximity of the antenna interconnection.
Figure 19B:
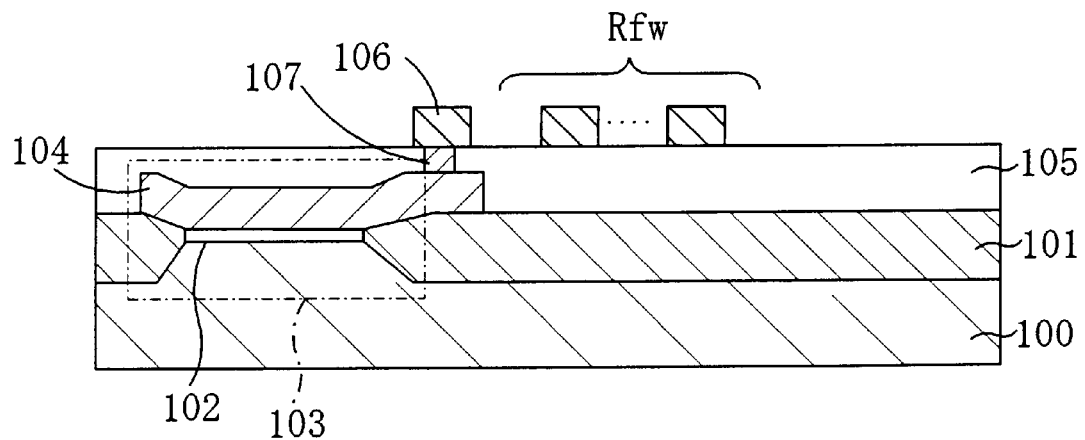
Figure 20A:
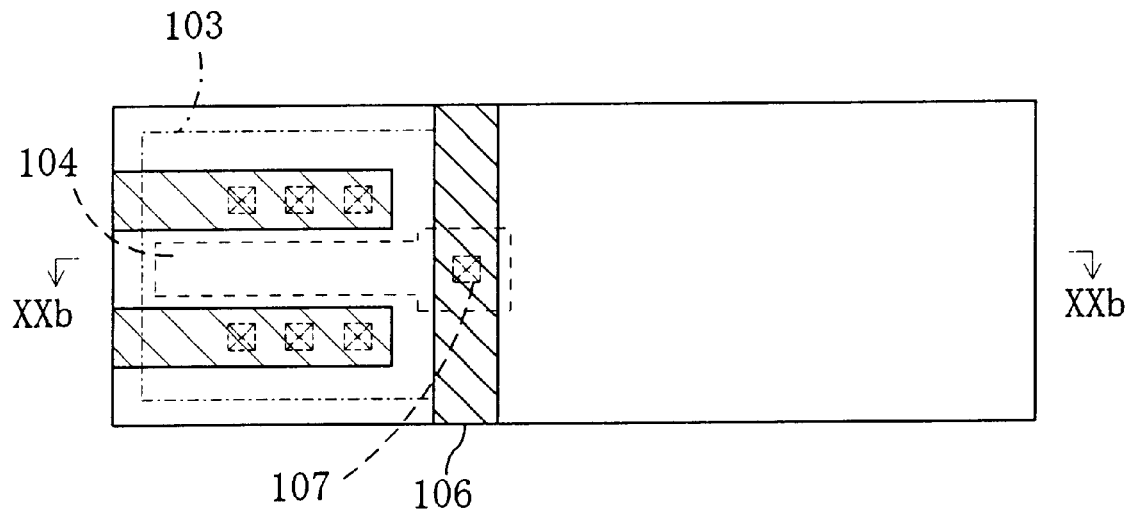
FIGS. 20(a) and 20(b) are plan and cross-sectional views of the conventional MOS device in a portion in which the floating interconnection region is absent in the proximity of the antenna interconnection.
Figure 20B:
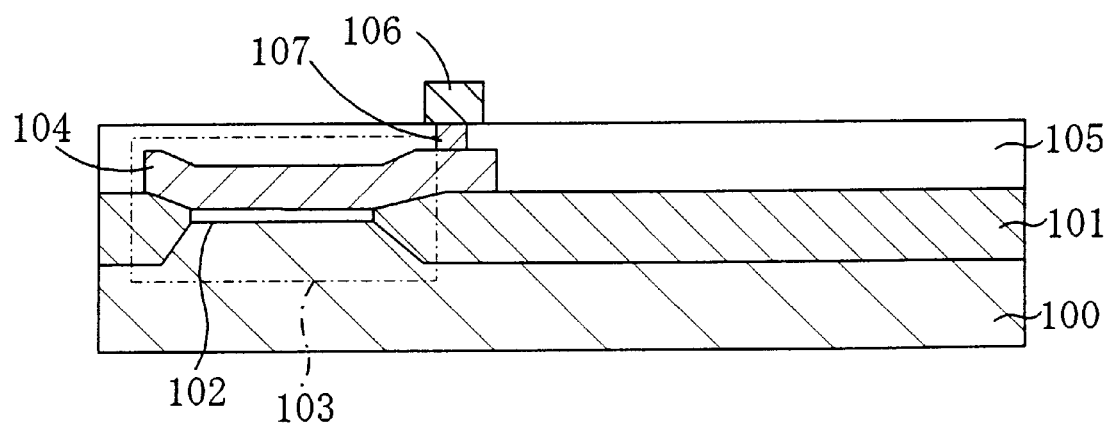

In the process of dry-etching the region shown in FIGS. 19(a) and 19(b), the photoresist films overlying the floating interconnections 112a, 112b, . . . around the antenna interconnection 106 connected to the gate electrode 104 are charged up, so that a change in characteristics such as a shift in threshold voltage due to the deterioration of the gate oxide film 102 is conspicuous. In the region shown in FIGS. 20(a) and 20(b), however, floating interconnections are not laid out around the antenna interconnection 106 connected to the gate electrode 104, so that a change in the characteristics of the transistor due to the deterioration of the gate oxide film during the dry-etching process is negligible. As a result, variations in the amount of deterioration incurred by the gate oxide film 102 during the dry-etching process increases variations in the characteristics of a transistor provided in the same integrated circuit.

On the other hand, though the antenna interconnection 106 connected to the gate electrode of the MOS transistor 103 in the semiconductor device of the present embodiment shown in FIGS. 10(a) and 10(b) is originally contiguous to the region Rfw in which the floating interconnections are densely laid out, the interconnection for charge dissipation 110 connected to the diode 109 is provided contiguously to the floating interconnection region Rfw. In the region shown in FIGS. 11(a) and 11(b), the floating interconnection 112x and the interconnection for charge dissipation 110 are provided contiguously to the antenna interconnection 106. The floating interconnection 112x and the interconnection for charge dissipation 110 are dummy interconnect patterns unnecessary for the operation of the integrated circuit. As a result, in the arrangement shown in FIGS. 11(a) and 11(b), the antenna interconnection 106, the floating interconnection 112x, and the interconnection for charge dissipation 110 are arranged at the same width and on the same spacing as the floating interconnections are arranged in the floating interconnection region Rfw shown in FIGS. 10(a) and 10(b).

Thus, the present embodiment can suppress not only a shift in threshold in the region in which the floating interconnections are densely laid out shown in FIGS. 10(a) and 10(b) to the order to 10 mV but also a shift in threshold in the region in which the floating interconnections are coarsely present shown in FIGS. 11(a) and 11(b) to the order of 10 mV. Consequently, although a shift in threshold is observed in a transistor during the dry-etching process, the amount of shift in threshold in each region can be held substantially constant, so that the threshold of each of the transistors in the integrated circuit readily falls in the range compliant with specifications, resulting in the formation of MOS transistors with high reliability.

In other words, variations in the characteristics of the transistor caused by the injection of charges into the gate oxide film during the dry-etching process can be suppressed by connecting, if the floating interconnection region covers a wide range, some of the floating interconnections on an appropriate spacing to the semiconductor substrate such that they serve as interconnections for charge dissipation and by sequentially forming, in the region around the antenna interconnection in which only few floating interconnections are present, the dummy floating interconnection and the dummy interconnection for charge dissipation contiguous to the antenna interconnection.

In the above third and fourth embodiments also, it has experimentally been confirmed that, even when over-etching is performed after the individual interconnections are completely formed and separated from each other, the effect of moving charges to the semiconductor substrate via the interconnection for charge dissipation is large as long as the spacing between the interconnection for charge dissipation and the floating interconnection in the floating interconnection region, which is contiguous to the interconnection for charge dissipation, is 1 $\mu$m or less, similarly to the above first and second embodiments. Since the ability to dissipate charges is higher as the spacing is smaller, remarkable effects can be exerted by reducing the spacing to a value within a range of the minimum design rule to the limit of resolution in consideration of the present tendency toward a further reduction in the design rules for MIS transistors.

(Fifth Embodiment)

Figure 12:
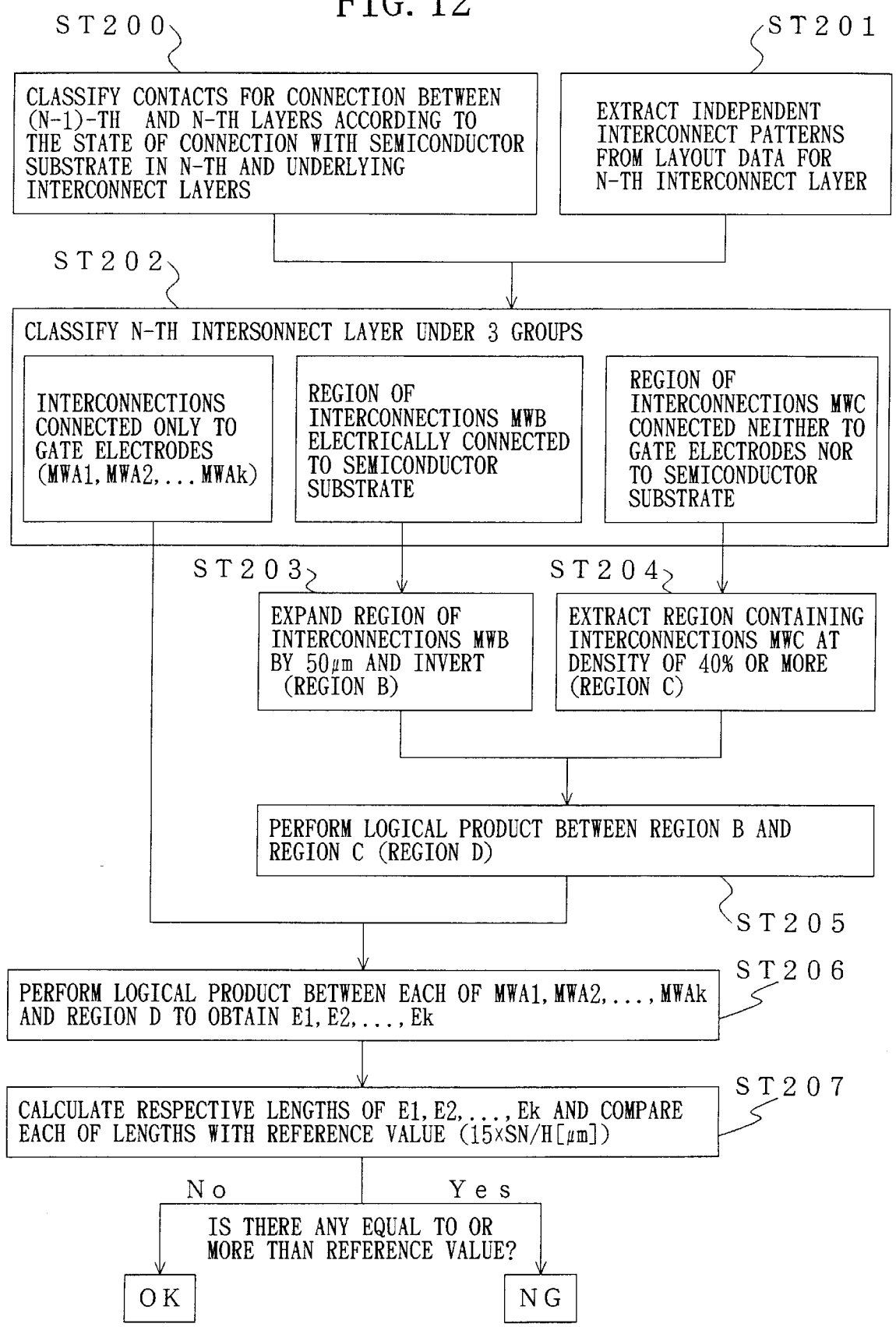
FIG. 12 is a flow chart showing the procedure for judging whether or not the structure of a MOS device according to a fifth embodiment being designed is proper.
Figure 13:
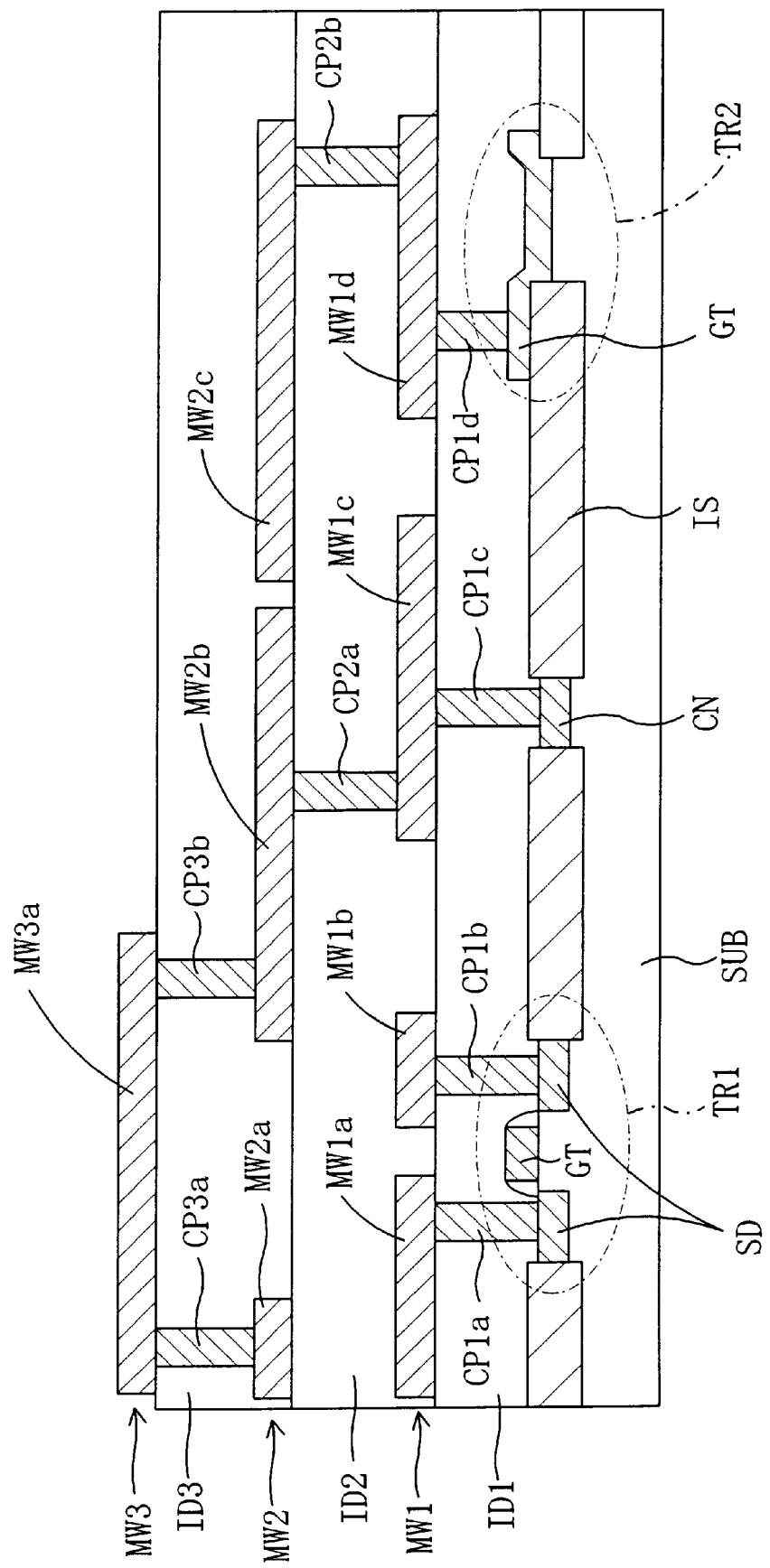
FIG. 13 is a cross-sectional view of the MOS device having a multilayer interconnect structure according to the fifth embodiment.

Below, a fifth embodiment will be described with reference to FIGS. 12 and 13. FIG. 12 is a flow chart showing the procedure for diagnosing the layout of interconnections. FIG. 13 is a cross-sectional view of a semiconductor device having a multi-layer interconnect structure which serves as a model in the diagnosis of the layout of interconnections.

As shown in FIG. 13, an isolation IS is formed on a semiconductor substrate SUB. In an active region surrounded by the isolation IS, there are formed transistors TR1 and TR2 each having source/drain regions SD and a gate electrode GT. The semiconductor substrate SUB is partially formed with a substrate terminal region CN for grounding. On the semiconductor substrate SUB, a first interlayer insulating film ID1, a first metal interconnect layer MW1, a second interlayer insulating film ID2, a second metal interconnect layer MW2, a third interlayer insulating film ID3, and a third metal interconnect layer MW3 are formed sequentially and upwardly relative to the semiconductor substrate SUB. Contact plugs CP for connecting the upper-layer and lower-layer metal interconnections to each other are formed by filling up connection holes bored in the individual interlayer insulating films ID1 to ID3. On the assumption that the above multilayer interconnect structure is used, a method of diagnosing the layout of interconnections will be described in accordance the flow chart of FIG. 12.

First, in Step ST200, contacts for providing connection between the (N-1)-th layer and the N-th layer are classified under the following three groups depending on the states of connection with the semiconductor substrate in the N-th and underlying interconnect layers:

(1) the contacts connected only to the gate electrode
(2) the contacts having resistor connection or rectifier connection with the semiconductor substrate
(3) the contacts connected neither to the gate electrode nor to the semiconductor substrate.

In Step ST201, independent interconnect patterns are extracted from data on the layout of interconnections in the N-th interconnect layer to obtain K independent interconnect patterns.

In Step ST202, all interconnect patterns in the N-th layer are classified under the following three groups based on the results obtained in the above Steps ST200 and ST201 and on the type of connection provided between each of the interconnect patterns and the semiconductor substrate in the N-th and underlying interconnect layers:

(1) the regions containing the interconnections MWA1, MWA2, . . . , MWAK connected only to the gate electrode (input respective sets of information S1, S2, . . . , Sk on the total area occupied by the gate insulating films of the transistors connected to the respective interconnections)
(2) the region of the interconnection MWB achieving resistor connection or rectifier connection with the semiconductor substrate
(3) the region of the interconnection MWC connected neither to the gate electrode nor to the semiconductor substrate In the second metal interconnect layer MW2 shown in FIG. 13, e.g., the interconnection MW2$a$ belongs to the above group (3), the interconnection MW2$b$ belongs to the above group (2), and the interconnection MW2$c$ belongs to the above group (1).

Next, in Step ST203, the area occupied by the region of the above interconnection MWB is expanded by 50 $\mu$m and inverted on a computer and the result of operations is designated as a region B. Then, a region occupied by the above interconnections MWC at an occupation ratio of 40% or more is extracted and designated as a region C in Step ST204. Subsequently, a logical product between the above regions B and C is performed and the resulting logical product is designated as a region D.

Next, in step ST206, logical products are performed between the region D and the respective regions of the interconnections MWA1, MWA2, . . . , MWAK connected only to the k independent gate electrodes obtained in the above step ST202 based on the results of processing obtained in Step ST202 and Step ST205 and the resulting logical products are designated as regions E1, E2, . . . , and Ek.

In the foregoing procedure, wiring density can be calculated as follows: When a wiring pitch compliant with the minimum interconnection rule is assumed to be p [$\mu$m], meshes 2p square or more are superimposed on the layout of interconnections and the area occupied by the pattern of interconnections in each of the meshes is calculated. For example, in a layer using interconnection rules of a minimum line width of 0.6 $\mu$m and a minimum line spacing of 0.6 $\mu$m (wiring pitch of p=1.2 $\mu$m), meshes 2.4 $\mu$m square are used to perform calculations.

Finally, in Step ST207, the lengths of the regions E1, E2, . . . , Ek calculated in the above Step ST206 are calculated and outputs "NG" when any one of the k interconnections has a length of Sn (n=1 to k)×15/H $\mu$m or more and outputs "OK" when no interconnection has a length of Sn×15/H $\mu$m or more (the height of the above metal interconnection in the N-th layer is assumed to be H [$\mu$m]).

In the present embodiment, it becomes possible to obtain the region B in which the charging up of the photoresist film during the dry-etching process is lessened in Step ST203 since the interconnection MWA electrically connected to the semiconductor substrate SUB is present and the region C in which floating interconnections are densely disposed in Step ST204. Accordingly, it becomes possible to calculate the region D in which the charging up of the photoresist film is remarkable by performing a logical product between the region B and the region C in Step ST205. In the interconnect pattern connected only to the gate electrode, if the length of the region included in the above region D surpasses, e.g., Sn (n=1 to k)×50/H $\mu$m, the presence thereof can be recognized by the processing performed in the above Step ST206 since the degradation of the characteristics of the above transistor during the dry-etching process surpasses a normal value. Consequently, it becomes possible to judge whether or not an increase in the degradation the characteristics of the transistor during the dry-etching process surpasses the normal value by processing the layout of interconnections on the computer in accordance with the procedure of the present embodiment. In other words, by repeatedly performing the placement and routing of interconnections till the result of judgment becomes satisfactory, a MIS device with excellent characteristics can be manufactured.

We claim:

1. A MIS device comprising:

a semiconductor substrate;

a MIS transistor formed in a first region of said semiconductor substrate and having a gate electrode, a gate insulating film, and source/drain regions;

an interlayer insulating film formed above said semiconductor substrate and said MIS transistor;

a first interconnection formed on said interlayer insulating film and connected to the gate electrode of said MIS transistor;

a conductive layer formed in a second region of said semiconductor substrate; and a second interconnection formed in proximity to said first interconnection on said interlayer insulating film and connected to the conductive layer in the second region of said semiconductor substrate, said second interconnection being positioned such that charges are movable between said first and second interconnections during an over-etching process in an etching process for forming said first and second interconnections.

2. A MIS device according to claim 1, wherein said first and second interconnections are composed of the same material and have the same thickness.

3. A MIS device according to claim 1, wherein said first interconnection has a length of 1 mm or more.

4. A MIS device according to claim 1, wherein said first interconnection and said second interconnection extend in proximity to each other over a length of 100 $\mu$m or more.

5. A MIS device according to claim 1, wherein a spacing between said first interconnection and said second interconnection is equal to or less than a minimum design rule.

6. A MIS device according to claim 1, wherein a spacing between said first interconnection and said second interconnection is equal to or less than 1.0 $\mu$m.

7. A MIS device according to claim 1, wherein said first interconnection is an external pad connected to the gate electrode of said MIS transistor and said second interconnection is formed to surround said external pad.

8. A MIS device comprising:

a semiconductor substrate;

a MIS transistor formed in a first region of said semiconductor substrate and having a gate electrode, a gate insulating film, and source/drain regions;

an interlayer insulating film formed above said semiconductor substrate and said MIS transistor;

a first interconnection formed on said interlayer insulating film and connected to the gate electrode of said MIS transistor;

a floating interconnection region formed in proximity to said first interconnection on said interlayer insulating film, wherein a plurality of second interconnections are densely disposed in a state disconnected from said gate electrode and said semiconductor substrate and are electrically floating;

a conductive layer formed in a second region of said semiconductor substrate; and a third interconnection formed in proximity to said floating interconnection region on said interlayer insulating film and connected to the conductive layer in the second region of said semiconductor substrate, said third interconnection being positioned such that charges are movable between said third interconnection and one of said plurality of second interconnections in said floating interconnection region during an over-etching process in an etching process for forming said third interconnection and said plurality of second interconnections.

9. A MIS device according to claim 8, wherein a spacing between any one of said second interconnections in said floating interconnection region and said third interconnection is equal to or less than 1.0 $\mu$m.

10. A MIS device according to claim 8, wherein a spacing between any one of said second interconnections in said floating interconnection region and said third interconnection is equal to or less than a minimum design rule.

11. A MIS device according to claim 8, wherein when a total area occupied by a gate insulating film of said MIS transistor is S $\mu$m$^2$ and a height of said first interconnection connected to the gate electrode of said MIS transistor is H $\mu$m, a length of each of said second interconnections is 15×S/H $\mu$m or more.

12. A MIS device according to claim 8, wherein a total area occupied by all of said second interconnections account for 40% or more of the area of said floating interconnection region.

13. A MIS device according to claim 8, wherein said MIS transistors and said first interconnections are disposed at a plurality of positions and all of said interconnections are disposed such that a spacing between each adjacent two of all of said interconnections is substantially equal for each of said MIS transistors.

* * * * *